United States Patent
Nishioka et al.

(10) Patent No.: US 9,404,732 B2
(45) Date of Patent: Aug. 2, 2016

(54) ELECTRONIC COMPONENT THICKNESS MEASUREMENT METHOD, METHOD FOR MANUFACTURING A SERIES OF ELECTRONIC COMPONENTS USING THE MEASUREMENT METHOD, A SERIES OF ELECTRONIC COMPONENTS MANUFACTURED BY THE MANUFACTURING METHOD, AND ELECTRONIC COMPONENT INSPECTION APPARATUS

(71) Applicant: Murata Manufacturing Co., Ltd., Nagaokakyo-shi, Kyoto-fu (JP)

(72) Inventors: Yoshinao Nishioka, Nagaokakyo (JP); Masayoshi Haruki, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 14/325,490

(22) Filed: Jul. 8, 2014

(65) Prior Publication Data

US 2015/0016071 A1    Jan. 15, 2015

(30) Foreign Application Priority Data

Jul. 11, 2013  (JP) ................................. 2013-145506
May 20, 2014  (JP) ................................. 2014-104262

(51) Int. Cl.
*G01B 11/28* (2006.01)
*G01B 11/06* (2006.01)
*H05K 1/18* (2006.01)

(52) U.S. Cl.
CPC ............ *G01B 11/06* (2013.01); *G01B 11/0641* (2013.01); *H05K 1/185* (2013.01)

(58) Field of Classification Search
CPC ........... G01B 11/06; H04N 7/18; G06K 9/00; G01R 1/02; G06F 17/30
See application file for complete search history.

(56) References Cited

U.S. PATENT DOCUMENTS

| | | | |
|---|---|---|---|
| 6,459,493 B1 | 10/2002 | Sugiura et al. | |
| 2008/0232673 A1* | 9/2008 | Miyauchi | 382/146 |
| 2012/0154807 A1 | 6/2012 | Usami | |
| 2012/0218397 A1* | 8/2012 | Monden | 348/77 |

(Continued)

FOREIGN PATENT DOCUMENTS

| | | |
|---|---|---|
| JP | 04-107000 A | 4/1992 |
| JP | 9-5048 A | 1/1997 |
| JP | 11-83453 A | 3/1999 |
| JP | 2003-139516 A | 5/2003 |
| JP | 2005-61982 A | 3/2005 |
| JP | 2012-127887 A | 7/2012 |
| WO | 2013/005841 A1 | 1/2013 |

OTHER PUBLICATIONS

Official Communication issued in corresponding Japanese Patent Application No. 2014-104262, mailed on May 24, 2016.

*Primary Examiner* — Tarifur Chowdhury
*Assistant Examiner* — Jamil Ahmed
(74) *Attorney, Agent, or Firm* — Keating & Bennett, LLP

(57) ABSTRACT

An electronic component thickness measurement method includes extracting, from a plurality of second reference lines in first image data and a plurality of second reference lines in second image data, only a second reference line at which a difference in intensity peak between respective second reference lines at a same position in the first image data and the second image data is smallest, and forming third image data including a first reference line and the extracted second reference line, and calculating a thickness of the electronic component from a distance between the first reference line and the second reference line in the third image data.

29 Claims, 14 Drawing Sheets

(56) References Cited

U.S. PATENT DOCUMENTS

2012/0317113 A1* 12/2012 Chen et al. .................... 707/737
2013/0207679 A1* 8/2013 Cheng et al. ............. 324/750.13
2014/0109389 A1 4/2014 Okamura
2014/0166883 A1* 6/2014 Ono et al. ................ 250/339.06

* cited by examiner

ELECTRONIC COMPONENT THICKNESS MEASUREMENT METHOD, METHOD FOR MANUFACTURING A SERIES OF ELECTRONIC COMPONENTS USING THE MEASUREMENT METHOD, A SERIES OF ELECTRONIC COMPONENTS MANUFACTURED BY THE MANUFACTURING METHOD, AND ELECTRONIC COMPONENT INSPECTION APPARATUS

BACKGROUND OF THE INVENTION

1. Field of the Invention

The present invention relates to an electronic component thickness measurement method, a method for manufacturing a series of electronic components using the measurement method, a series of electronic components manufactured by the manufacturing method, and an electronic component inspection apparatus, and particularly relates to a method for measuring the thickness of an electronic component mounted on a transparent plate, a method for manufacturing a series of electronic components using the measurement method, a series of electronic components manufactured by the manufacturing method, and an inspection apparatus for an electronic component mounted on a transparent plate.

2. Description of the Related Art

Japanese Patent Laying-Open No. 4-107000 discloses a configuration of an appearance classification apparatus for electronic components. In the appearance classification apparatus for electronic components that is disclosed in Japanese Patent Laying-Open No. 4-107000, components fed from a component feeder are spaced from each other on a continuously rotating transparent disk, a camera, which is disposed at a position that enables the camera to freely photograph the components on the transparent disk, photographs instantaneous images of the components, and the appearances of the components are inspected based on image signals derived from the instantaneous images. In the appearance classification apparatus for electronic components, the electronic components are classified, based on the results of the appearance inspection, by a classification mechanism provided at a certain position along a track of the components on the transparent disk.

In some cases, electronic components have to be classified by the appearance and the thickness. In the case where the appearance classification apparatus for electronic components that is disclosed in Japanese Patent Laying-Open No. 4-107000 is to measure the thickness of an electronic component via a camera, it is difficult to accurately measure the thickness of the electronic component due to the limitation in depth of field of the camera.

One method for precisely measuring the shape of an electronic component is the light section method. According to the light section method, light is applied to an electronic component from directly above the electronic component, the light reflected therefrom is received from which an image is obtained, and the shape of the electronic component is measured based on the image.

In the case where the thickness of an electronic component mounted on a transparent plate is to be measured via the light section method, the following method may be employed. Specifically, light is applied to the electronic component and the transparent plate, and the thickness of the electronic component is measured based on the distance between the position where the reflected light which is reflected from the upper surface of the electronic component is received and the position where the reflected light reflected from the upper surface of the transparent plate is received.

Regarding this method, however, the reflection coefficient of the applied light on the transparent plate is low and a part of the applied light causes multi-reflection in the transparent plate. Due to this, the position where the reflected light reflected from the upper surface of the transparent plate is received, which is used as a reference for measuring the thickness of the electronic component, is made unclear. It has therefore been difficult to measure via the light section method the thickness of an electronic component mounted on a transparent plate.

SUMMARY OF THE INVENTION

Preferred embodiments of the present invention provide an electronic component thickness measurement method by which the thickness of an electronic component mounted on a transparent plate is capable of being measured by the light section method, a method for manufacturing a series of electronic components using the measurement method, a series of electronic components manufactured by the manufacturing method, and an inspection apparatus for an electronic component.

An electronic component thickness measurement method according to a first aspect of one of a plurality of preferred embodiments of the present invention includes the steps of applying a first electromagnetic wave from obliquely above to an electronic component and a transparent plate on which the electronic component is mounted; receiving reflected waves of the first electromagnetic wave and forming first image data including a first reference line representing an intensity peak of a reflected wave reflected from an upper surface of the electronic component and a plurality of second reference lines representing respective intensity peaks of a plurality of reflected waves reflected from the transparent plate; applying a second electromagnetic wave, which is different from the first electromagnetic wave in direction of polarization, from obliquely above and at the same angle as the first electromagnetic wave, to a position on the electronic component and the transparent plate identical or substantially identical to a position to which the first electromagnetic wave is applied; and receiving reflected waves of the second electromagnetic wave and forming second image data including a first reference line representing an intensity peak of a reflected wave reflected from the upper surface of the electronic component and a plurality of second reference lines representing respective intensity peaks of a plurality of reflected waves reflected from the transparent plate. The electronic component thickness measurement method also includes the steps of: extracting, from a plurality of the second reference lines in the first image data and a plurality of the second reference lines in the second image data, only a second reference line at which a difference in intensity peak between respective second reference lines at the same position in the first image data and the second image data is smallest, and forming third image data including the first reference line and the extracted second reference line; and calculating the thickness of the electronic component from a distance between the first reference line and the second reference line in the third image data.

In a preferred embodiment of the present invention, the first electromagnetic wave and the second electromagnetic wave preferably each have a wavelength of about 400 nm or more and about 500 nm or less, for example.

In a preferred embodiment of the present invention, the electronic component includes a plurality of external electrodes on a surface of the electronic component. In the step of applying a first electromagnetic wave, the first electromagnetic wave is applied to at least any one of a plurality of the external electrodes.

In a preferred embodiment of the present invention, in the step of applying a first electromagnetic wave, the first electromagnetic wave is applied so that a plurality of the external electrodes are each irradiated with the first electromagnetic wave.

In a preferred embodiment of the present invention, each of the step of applying a first electromagnetic wave, the step of forming first image data, the step of applying a second electromagnetic wave, the step of forming second image data, the step of forming third image data, and the step of calculating the thickness of the electronic component is performed for positions on one electronic component that are different from each other.

In a preferred embodiment of the present invention, the transparent plate preferably has a thickness of about 1.2 mm or more and about 5.0 mm or less, for example.

In a preferred embodiment of the present invention, the transparent plate is made of glass. The first electromagnetic wave and the second electromagnetic wave differ from each other in direction of polarization by 90° or about 90°, for example. An angle of incidence of the first electromagnetic wave with respect to the upper surface of the electronic component preferably is about 10° or more and about 43.5° or less, for example.

An electronic component thickness measurement method according to a second aspect of one of a plurality of preferred embodiments of the present invention includes the steps of applying an electromagnetic wave to an electronic component and a transparent plate on which the electronic component is mounted; receiving reflected waves of the electromagnetic wave reflected respectively from the electronic component and the transparent plate; and calculating the thickness of the electronic component from a positional relationship between a position receiving an intensity peak of the reflected wave reflected from an upper surface of the electronic component and a position receiving a highest intensity peak among a plurality of reflected waves reflected from the transparent plate.

In a preferred embodiment of the present invention, the electronic component includes a plurality of external electrodes on a surface of the electronic component. In the step of applying an electromagnetic wave, the electromagnetic wave is applied to at least any one of a plurality of the external electrodes.

In a preferred embodiment of the present invention, in the step of applying an electromagnetic wave, the electromagnetic wave is applied so that a plurality of the external electrodes are each irradiated with the electromagnetic wave.

In a preferred embodiment of the present invention, each of the step of applying an electromagnetic wave, the step of receiving reflected waves, and the step of calculating the thickness of the electronic component is performed for positions on one electronic component that are different from each other.

A method for manufacturing a series of electronic components according to a third aspect of one of a plurality of preferred embodiments of the present invention is a method for manufacturing a series of electronic components including of a plurality of electronic components packaged into a single unit. The method for manufacturing a series of electronic components includes the steps of photographing an appearance of each electronic component mounted on a transparent plate via a photography device disposed at least below the transparent plate; applying a first electromagnetic wave from obliquely above to the electronic component and the transparent plate; receiving reflected waves of the first electromagnetic wave and forming first image data including a first reference line representing an intensity peak of a reflected wave reflected from an upper surface of the electronic component and a plurality of second reference lines representing respective intensity peaks of a plurality of reflected waves reflected from the transparent plate; applying a second electromagnetic wave, which is different from the first electromagnetic wave in direction of polarization, from obliquely above and at the same angle as the first electromagnetic wave, to a position on the electronic component and the transparent plate identical or substantially identical to a position to which the first electromagnetic wave is applied; and receiving reflected waves of the second electromagnetic wave and forming second image data including a first reference line representing an intensity peak of a reflected wave reflected from the upper surface of the electronic component and a plurality of second reference lines representing respective intensity peaks of a plurality of reflected waves reflected from the transparent plate. The method for manufacturing a series of electronic components also includes the steps of extracting, from a plurality of the second reference lines in the first image data and a plurality of the second reference lines in the second image data, only a second reference line at which a difference in intensity peak between respective second reference lines at the same position in the first image data and the second image data is smallest, and forming third image data including the first reference line and the extracted second reference line; calculating the thickness of the electronic component from a distance between the first reference line and the second reference line in the third image data; classifying a plurality of the electronic components into a plurality of groups, according to the appearance of each electronic component photographed in the step of photographing and the thickness of each electronic component calculated in the step of calculating the thickness of the electronic component; and taping a plurality of the electronic components classified into any one group of the plurality of groups.

A method for manufacturing a series of electronic components according to a fourth aspect of one of a plurality of preferred embodiments of the present invention is a method for manufacturing a series of electronic components including a plurality of electronic components packaged into a single unit. The method for manufacturing a series of electronic components includes the steps of photographing an appearance of each electronic component mounted on a transparent plate via a photography device disposed at least below the transparent plate; applying an electromagnetic wave to the electronic component and the transparent plate; receiving reflected waves of the electromagnetic wave reflected respectively from the electronic component and the transparent plate; calculating the thickness of the electronic component from a positional relationship between a position receiving an intensity peak of the reflected wave reflected from an upper surface of the electronic component and a position receiving a highest intensity peak among a plurality of reflected waves reflected from the transparent plate; classifying a plurality of the electronic components into a plurality of groups, according to the appearance of each electronic component photographed in the step of photographing and the thickness of each electronic component calculated in the step of calculating the thickness of the electronic component; and taping a plurality of the electronic components classified into any one group of the plurality of groups.

A series of electronic components according to a fifth aspect of one of a plurality of preferred embodiments of the present invention is a series of electronic components manufactured by the method for manufacturing a series of electronic components as described above, and a difference in thickness between a thickest electronic component and a thinnest electronic component among a plurality of the electronic components classified into the one group preferably is about 10 µm or less, for example.

In a preferred embodiment of the present invention, the electronic component includes a body and external electrodes. The body includes a pair of main surfaces located opposite to each other, a pair of end surfaces connecting the pair of main surfaces to each other and located opposite to each other, and a pair of side surfaces connecting the pair of main surfaces to each other and also connecting the pair of end surfaces to each other. The external electrodes are provided on each of the pair of main surfaces. The thickness of the electronic component is a distance, along a direction connecting the pair of main surfaces, between outer surfaces of the external electrodes provided on each of the pair of main surfaces.

In a preferred embodiment of the present invention, the thickness of a thickest electronic component among a plurality of the electronic components classified into the one group preferably is about 0.25 mm or less, for example.

An inspection apparatus for an electronic component according to a sixth aspect of one of a plurality of preferred embodiments of the present invention is an inspection apparatus for an electronic component for conducting an appearance inspection and taking a thickness measurement. The inspection apparatus for an electronic component includes a transparent plate on which the electronic component is mounted; a photography device configured to photograph an appearance of the electronic component at least from below the transparent plate; and a thickness meter measuring the thickness of the electronic component. The thickness meter includes an irradiation unit and a reception unit. The irradiation unit applies an electromagnetic wave to the electronic component and the transparent plate. The reception unit receives reflected waves of the electromagnetic wave reflected respectively from the electronic component and the transparent plate. The thickness meter calculates the thickness of the electronic component from a positional relationship between a position receiving an intensity peak of the reflected wave reflected from an upper surface of the electronic component and a position receiving a highest intensity peak among a plurality of reflected waves reflected from the transparent plate.

In a preferred embodiment of the present invention, the irradiation unit applies a first electromagnetic wave from obliquely above to the electronic component and the transparent plate, and applies a second electromagnetic wave, which is different from the first electromagnetic wave in direction of polarization, from obliquely above and at the same angle as the first electromagnetic wave, to a position on the electronic component and the transparent plate identical or substantially identical to a position to which the first electromagnetic wave is applied. The reception unit receives reflected waves of the first electromagnetic wave and forms first image data including a first reference line representing an intensity peak of a reflected wave reflected from the upper surface of the electronic component and a plurality of second reference lines representing respective intensity peaks of a plurality of reflected waves reflected from the transparent plate, and the reception unit receives reflected waves of the second electromagnetic wave and forms second image data including a first reference line representing an intensity peak of a reflected wave reflected from the upper surface of the electronic component and a plurality of second reference lines representing respective intensity peaks of a plurality of reflected waves reflected from the transparent plate. The thickness meter extracts, from a plurality of the second reference lines in the first image data and a plurality of the second reference lines in the second image data, only a second reference line at which a difference in intensity peak between respective second reference lines at the same position in the first image data and the second image data is smallest, forms third image data including the first reference line and the extracted second reference line, and calculates the thickness of the electronic component from a distance between the first reference line and the second reference line in the third image data.

In a preferred embodiment of the present invention, the electronic component includes a plurality of external electrodes on a surface of the electronic component. The irradiation unit applies the first electromagnetic wave to at least any one of a plurality of the external electrodes.

In a preferred embodiment of the present invention, the irradiation unit applies the first electromagnetic wave so that a plurality of the external electrodes are each irradiated with the first electromagnetic wave.

In a preferred embodiment of the present invention, the thickness meter measures respective thicknesses at positions different from each other on one electronic component.

In a preferred embodiment of the present invention, the inspection apparatus for an electronic component further includes a classification mechanism classifying a plurality of electronic components into a plurality of groups. The classification mechanism includes a plurality of containers configured to receive the electronic components and a plurality of discharge mechanisms configured to move the electronic components on the transparent plate into the containers.

In accordance with various preferred embodiments of the present invention, the thickness of an electronic component mounted on a transparent plate is measured via the light section method.

The above and other elements, features, steps, characteristics and advantages of the present invention will become more apparent from the following detailed description preferred embodiments with reference to the attached drawings.

DETAILED DESCRIPTION OF THE PREFERRED EMBODIMENTS

Figure 1:
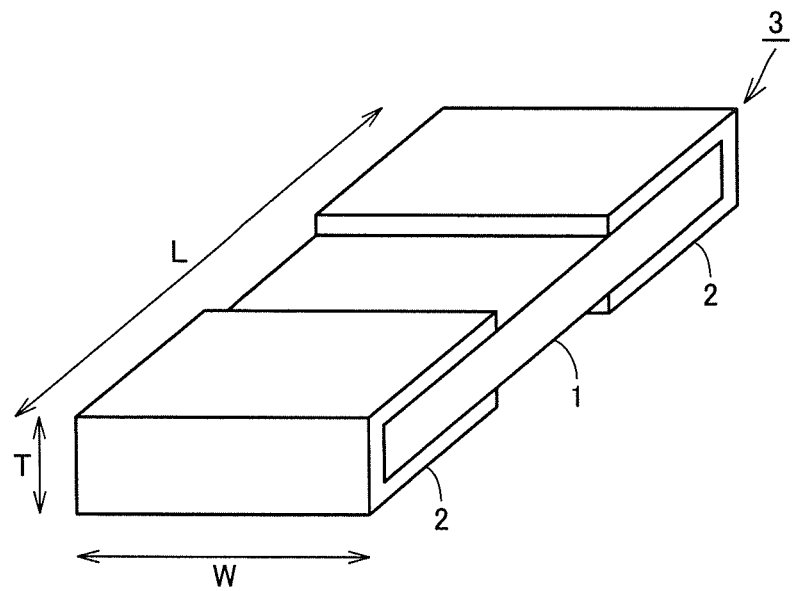
FIG. 1 is a perspective view showing a configuration of a multilayer ceramic capacitor.

A description will hereinafter be made, with reference to the drawings, of an electronic component thickness measurement method, a method for manufacturing a series of electronic components using the electronic component thickness measurement method, a series of electronic components manufactured by the manufacturing method, and an inspection apparatus for an electronic component, according to each preferred embodiment of the present invention. In the following description of the preferred embodiments, the same or corresponding elements in the drawings are denoted by the same reference characters, and a description thereof will not be repeated. In the following description, a multilayer ceramic capacitor given as an electronic component will be explained. The electronic component, however, is not limited to the capacitor, but includes piezoelectric component, thermistor, or inductor, or the like.

First Preferred Embodiment

A multilayer ceramic capacitor which is an example of the electronic component will first be described. FIG. 1 is a perspective view showing a configuration of the multilayer ceramic capacitor. As shown in FIG. 1, multilayer ceramic capacitor 3 includes a body and an external electrode 2. In body 1, ceramic layers and flat-plate-shaped internal electrodes are alternately layered.

Body 1 includes a pair of main surfaces perpendicular or substantially perpendicular to a thickness direction T, a pair of end surfaces perpendicular or substantially perpendicular to a longitudinal direction L, and a pair of side surfaces perpendicular or substantially perpendicular to a width direction W. Namely, body 1 includes a pair of main surfaces located opposite to each other, a pair of end surfaces connecting the pair of main surfaces to each other and located opposite to each other, and a pair of side surfaces connecting the pair of main surfaces to each other and also connecting the pair of end surfaces to each other. While body 1 preferably has an outer shape that is a rectangular or substantially rectangular parallelepiped, at least one of its corners and ridgelines may be rounded. A pair of external electrodes 2 is provided in such a manner that the external electrodes are opposite to each other along the longitudinal direction L of body 1. External electrodes 2 are provided on each of the pair of main surfaces.

For example, multilayer ceramic capacitor 3 preferably has a dimension in longitudinal direction L of 1.0 mm, a dimension in width direction W of 0.5 mm, and a dimension in thickness direction T of 0.10 mm or more and 0.13 mm or less. In the present preferred embodiment, the thickness of multilayer ceramic capacitor 3 refers to the distance, along the direction along which the main surfaces of the pair of main surfaces are connected to each other, between the outer surfaces of external electrodes 2 provided on each of the pair of main surfaces. For example, a thin multilayer ceramic capacitor 3 preferably having a thickness of about 0.25 mm or less may be used in the state of being embedded in a substrate.

Figure 2:
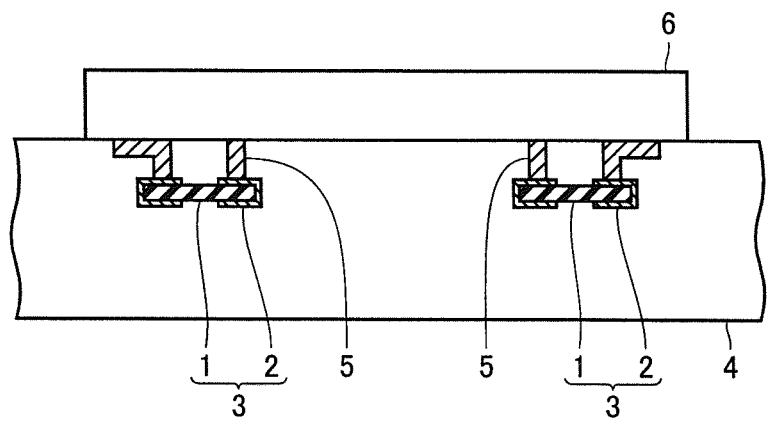
FIG. 2 is a cross-sectional view showing a mount structure for multilayer ceramic capacitors embedded in a substrate.

FIG. 2 is a cross-sectional view showing a mount structure for multilayer ceramic capacitors embedded in a substrate. As shown in FIG. 2, multilayer ceramic capacitor 3 is used in the state of being embedded in substrate 4. Specifically, an IC (Integrated Circuit) chip 6 mounted on a surface of a substrate 4 and multilayer ceramic capacitor 3 are electrically connected to each other by a via 5.

It is required for multilayer ceramic capacitors 3 embedded in substrate 4 as described above to have a small thickness variation therebetween. For example, it is preferable for multilayer ceramic capacitors 3 to have, at its portion where external electrodes 2 are provided, a thickness variation of within about 10 μm, for example. It is also preferably for multilayer ceramic capacitor 3 to have no chips, cracks, or the like. Thus, an appearance inspection and a thickness measurement may be performed for all of mass-produced multilayer ceramic capacitors 3.

Figure 3:
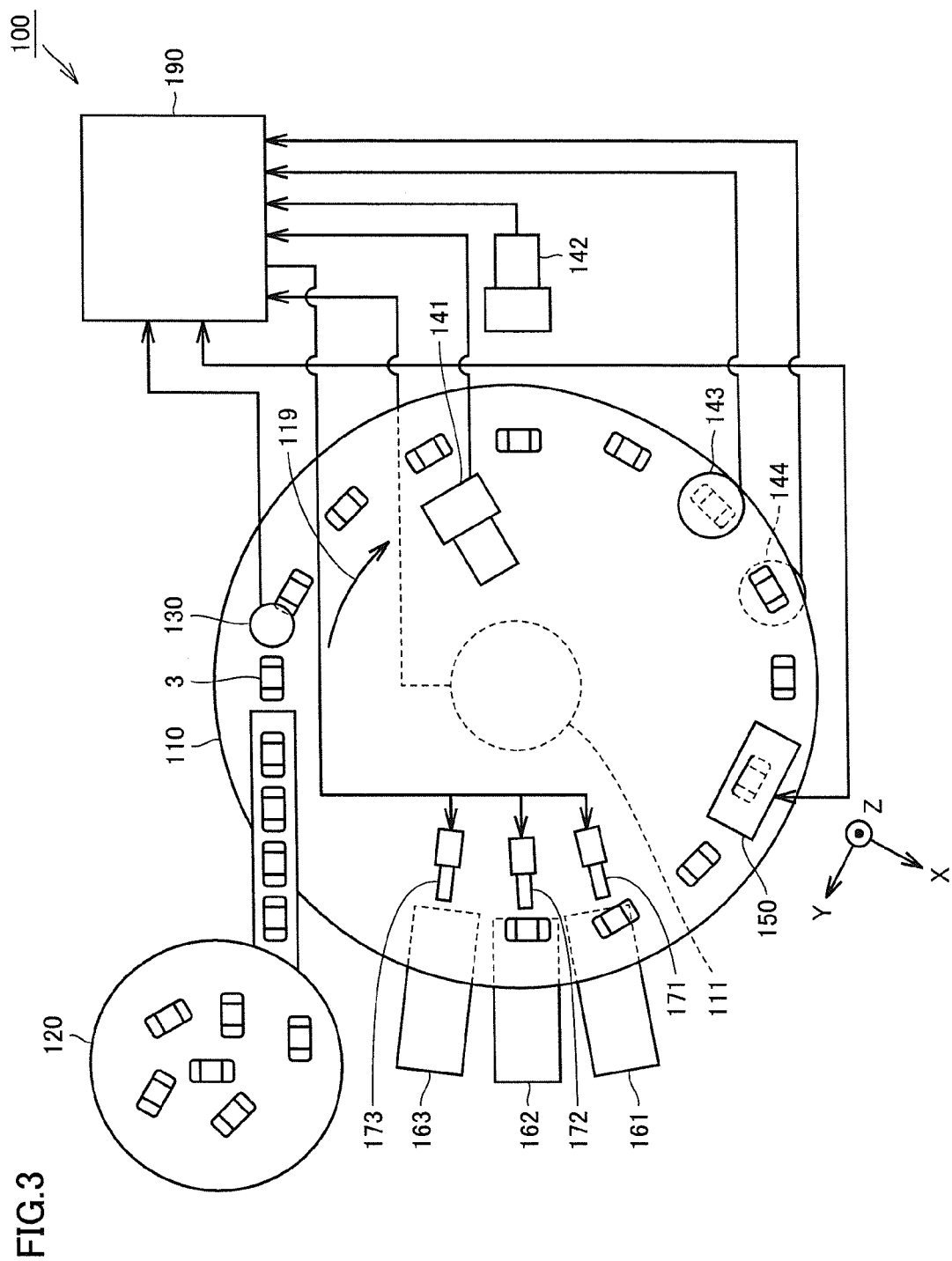
FIG. 3 is a plan view showing a configuration of an inspection apparatus for carrying out an electronic component thickness measurement method according to a first preferred embodiment of the present invention.

In the following, a description will be made of a configuration of an inspection apparatus for an electronic component according to the first preferred embodiment of the present invention, conducting in-line appearance inspection and thickness measurement for mass-produced multilayer ceramic capacitors 3. FIG. 3 is a plan view showing a configuration of the inspection apparatus for carrying out an electronic component thickness measurement method according to the first preferred embodiment of the present invention.

As shown in FIG. 3, inspection apparatus 100 for carrying out the thickness measurement method for multilayer ceramic capacitor 3 which is an electronic component according to the first preferred embodiment of the present invention includes a disk-shaped transparent plate 110 on which multilayer ceramic capacitor 3 is to be mounted. Transparent plate 110 is formed of glass transmitting electromagnetic waves (light). It should be noted that transparent plate 110 may also be formed of a resin transmitting electromagnetic waves (light).

In the present preferred embodiment, transparent plate 110 preferably has a thickness of about 1.2 mm, for example. Transparent plate 110 preferably has a thickness of about 1.2 mm or more and about 5.0 mm or less, for example. In the case where the thickness of transparent plate 110 is smaller than about 1.2 mm, it is difficult to extract, from reflected waves which are multi-reflected from transparent plate 110 as will be described later herein, the reflected wave which is reflected from the upper surface of transparent plate 110. In the case where the thickness of transparent plate 110 is larger than about 5.0 mm, it is difficult to photograph the appearance of multilayer ceramic capacitor 3 through transparent plate 110 as will be described later herein.

To transparent plate 110, a rotary encoder 111 is attached to support transparent plate 110 in such a manner that enables transparent plate 110 to continuously rotate. Continuous rotation of transparent plate 110 in the direction indicated by an arrow 119 causes multilayer ceramic capacitor 3 mounted on the circumferential edge of transparent plate 110 to be transported along a circumferential track at a constant rate.

Inspection apparatus 100 includes a chip feeder 120 for feeding multilayer ceramic capacitors 3 onto transparent plate 110. Chip feeder 120 aligns multilayer ceramic capacitors 3 while vibrating them, to accordingly place a plurality of multilayer ceramic capacitors 3 one by one on transparent plate 110 so that the capacitors are oriented in a certain direction and spaced from each other. In the present preferred embodiment, multilayer ceramic capacitors 3 are aligned so that the longitudinal direction of multilayer ceramic capacitor 3 is the direction in which the capacitors proceed.

Inspection apparatus 100 includes a sensor 130 configured to detect multilayer ceramic capacitor 3 placed by chip feeder 120 onto transparent plate 110. As sensor 130, a known sensor such as infrared sensor can be used, for example.

Inspection apparatus 100 includes four cameras which are each a photography device configured to inspect the appearance of multilayer ceramic capacitor 3. Specifically, inspection apparatus 100 includes: a first camera 141 located higher than transparent plate 110 and located inside the track along which multilayer ceramic capacitor 3 is transported, to photograph one side surface of multilayer ceramic capacitor 3; a second camera 142 located higher than transparent plate 110 and located outside the track along which multilayer ceramic capacitor 3 is transported, to photograph the other side surface of multilayer ceramic capacitor 3; a third camera 143 located higher than transparent plate 110 and above the track along which multilayer ceramic capacitor 3 is transported, to photograph one main surface of multilayer ceramic capacitor 3; and a fourth camera 144 located lower than transparent plate 110 and below the track along which multilayer ceramic capacitor 3 is transported, to photograph the other main surface of multilayer ceramic capacitor 3.

Thus, transparent plate 110 is used in order to enable the other main surface of multilayer ceramic capacitor 3 to be photographed through transparent plate 110. In view of the fact that electromagnetic waves (light) are to be passed through transparent plate 110, the thickness of transparent plate 110 is preferably about 5 mm or less, for example. Inspection apparatus 100 may further include a camera configured to photograph end surface of multilayer ceramic capacitor 3.

Inspection apparatus 100 includes a thickness meter 150 configured to inspect the thickness of multilayer ceramic capacitor 3. Thickness meter 150 is located higher than transparent plate 110 and located above the track along which multilayer ceramic capacitor 3 is transported. Thickness meter 150 uses the light section method to measure the thickness of multilayer ceramic capacitor 3. The configuration and the operation of thickness meter 150 will be described later herein.

Inspection apparatus 100 includes a classification mechanism configured to classify a plurality of multilayer ceramic capacitors 3 into a plurality of groups. The classification mechanism preferably includes a plurality of containers configured to receive multilayer ceramic capacitors 3 and a plurality of discharge mechanisms configured to move multilayer ceramic capacitors 3 on transparent plate 110 into the containers. While the present preferred embodiment uses an air blower as the discharge mechanism, a swing member may be used.

In the present preferred embodiment, a plurality of multilayer ceramic capacitors 3 are classified into three groups. Accordingly, the classification mechanism includes three containers and three air blowers.

Specifically, the classification mechanism preferably includes a first air blower 171 configured to blow away into a first container 161 a first group of multilayer ceramic capacitors 3 which have been identified as non-defective in both the appearance inspection and the thickness inspection; a second air blower 172 configured to blow away into a second container 162 a second group of multilayer ceramic capacitors 3 which have been identified as non-defective in the appearance inspection and defective in the thickness inspection; and a third air blower 173 configured to blow away into a third container 163 a third group of multilayer ceramic capacitors 3 which have been identified as defective in the appearance inspection. In the case where multilayer ceramic capacitors 3 are to be ranked according to the thickness, the first group of multilayer ceramic capacitors 3 may further be classified into a plurality of groups.

Inspection apparatus 100 includes a control unit 190. Control unit 190 is electrically connected to each of rotary encoder 111, sensor 130, first camera 141, second camera 142, third camera 143, fourth camera 144, thickness meter 150, first air blower 171, second air blower 172, and third air blower 173.

To control unit 190, rotary encoder 111 inputs the rotational speed of transparent plate 110. To control unit 190, sensor 130 inputs the time when multilayer ceramic capacitor 3 passed a predetermined position on the circumferential track. From the rotational speed which is input from rotary encoder 111 and the time which is input from sensor 130, control unit 190 identifies all the time the position of each multilayer ceramic capacitor 3 which varies with passage of time. Control unit 190 numbers multilayer ceramic capacitors 3 detected by sensor 130 and stores the numbered multilayer ceramic capacitors 3 in a database.

To control unit 190, each of first camera 141, second camera 142, third camera 143, and fourth camera 144 inputs the appearance image data of multilayer ceramic capacitors 3. To control unit 190, a program is input in advance to identify the appearance of multilayer ceramic capacitor 3. Following this program, control unit 190 identifies whether multilayer ceramic capacitor 3 has chips or cracks therein. Control unit 190 associates the results of the appearance inspection thus conducted, with respective numbers of multilayer ceramic capacitors 3, and stores the results in the database.

When multilayer ceramic capacitor 3 reaches the position below thickness meter 150, control unit 190 activates thickness meter 150 to cause it to measure the thickness of this multilayer ceramic capacitor 3. In control unit 190, operational conditions of thickness meter 150 have been input in advance to the database, and control unit 190 selects any of the operational conditions to cause thickness meter 150 to measure the thickness of multilayer ceramic capacitor 3.

To control unit 190, thickness meter 150 inputs the data of the measured thickness of multilayer ceramic capacitor 3. In control unit 190, a specified thickness of multilayer ceramic capacitor 3 has been input in advance to the database. Control unit 190 consults the database to determine whether or not the thickness of multilayer ceramic capacitor 3 falls within a specified range. Control unit 190 associates the result of the thickness inspection with the number of each multilayer ceramic capacitor 3 and stores the result in the database.

In the database, control unit 190 classifies, into the first group, multilayer ceramic capacitor 3 which has been identified as non-defective in both the appearance inspection and the thickness inspection, classifies, into the second group, multilayer ceramic capacitor 3 which has been identified as non-defective in the appearance inspection and defective in the thickness inspection, and classifies, into the third group, multilayer ceramic capacitor 3 which has been identified as defective in the appearance inspection.

When multilayer ceramic capacitor 3 classified into the first group reaches the position in front of first air blower 171, control unit 190 operates first air blower 171 to cause the blower to blow this multilayer ceramic capacitor 3 away into first container 161. When multilayer ceramic capacitor 3 classified into the second group reaches the position in front of second air blower 172, control unit 190 operates second air blower 172 to cause the blower to blow this multilayer ceramic capacitor 3 away into second container 162. When multilayer ceramic capacitor 3 classified into the third group reaches the position in front of third air blower 173, control unit 190 operates third air blower 173 to cause the blower to blow this multilayer ceramic capacitor 3 away into third container 163.

In this way, a plurality of multilayer ceramic capacitors are classified into the three groups. Accordingly, from mass-produced multilayer ceramic capacitors 3, only the products identified as non-defective in the appearance inspection and the thickness inspection are selected and used.

Figure 4:
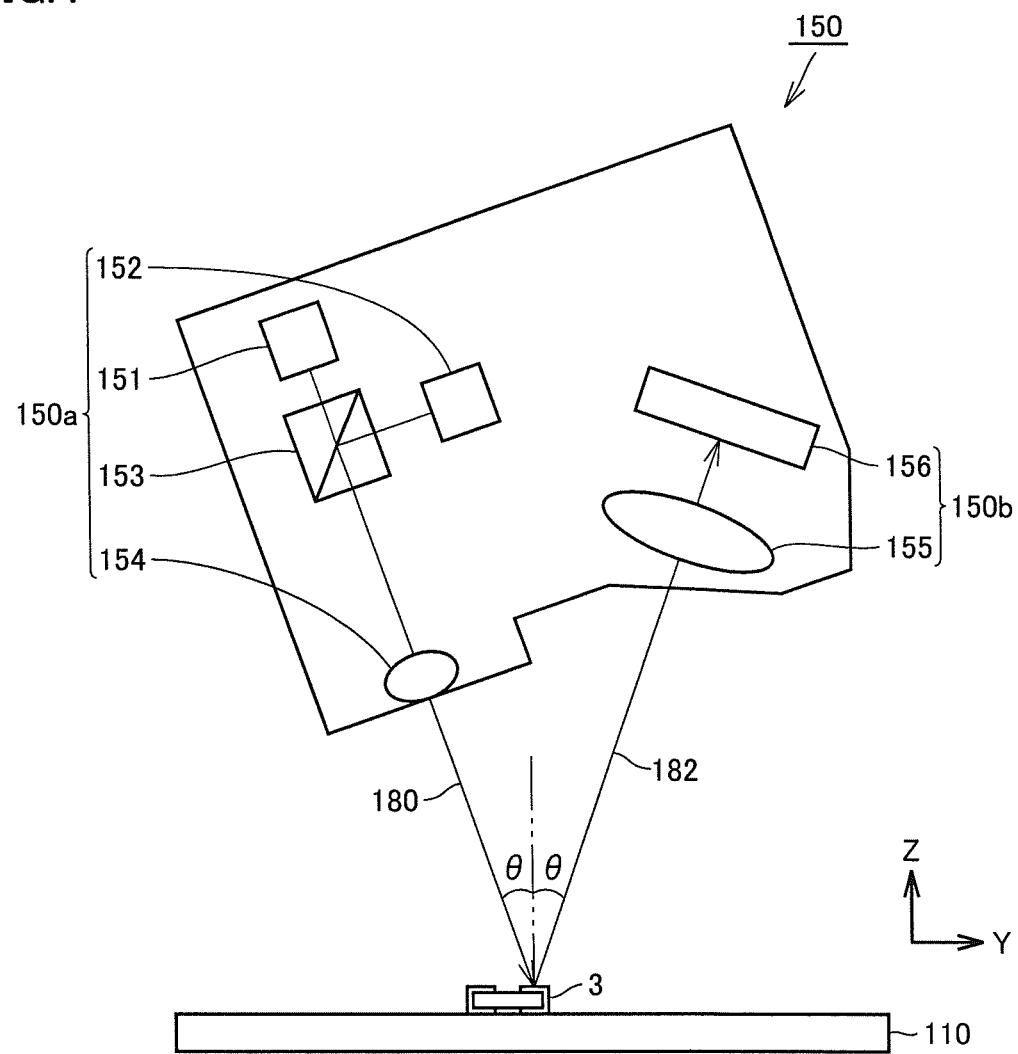
FIG. 4 shows a configuration of a thickness meter according to the first preferred embodiment of the present invention.
Figure 5:
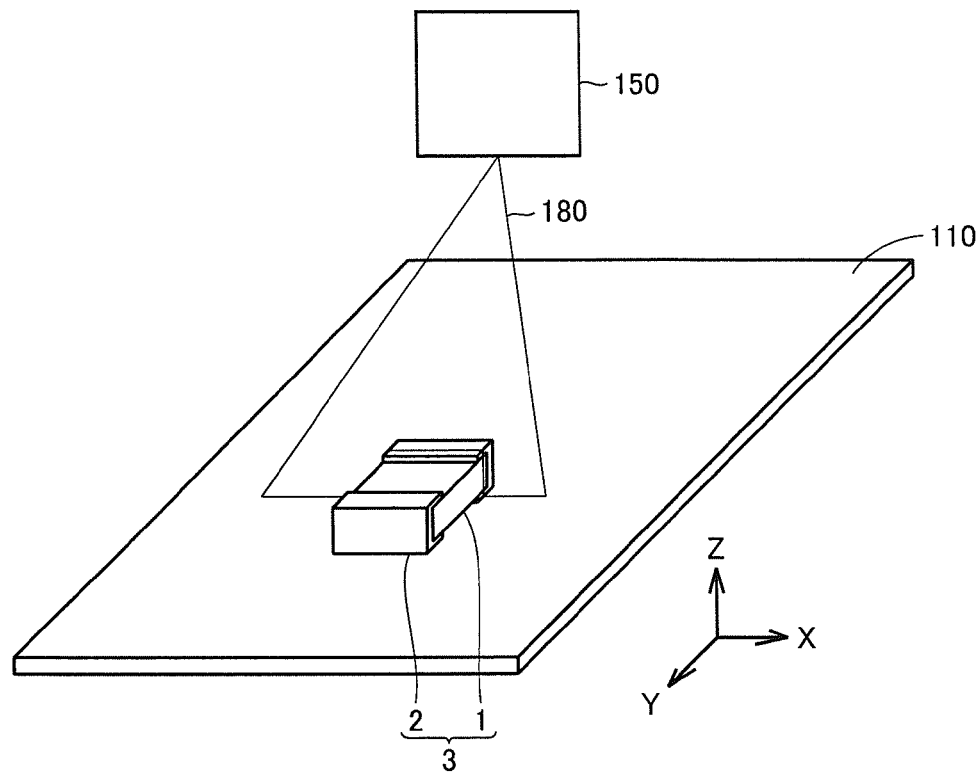
FIG. 5 is a perspective view showing a state where an electromagnetic wave is applied from a thickness meter according to the first preferred embodiment of the present invention.

In the following, the configuration and the operation of thickness meter 150 will be described. FIG. 4 shows the configuration of the thickness meter according to the present preferred embodiment. FIG. 5 is a perspective view showing a state where an electromagnetic wave is applied from the thickness meter according to the present preferred embodiment. In FIG. 5, the direction parallel to width direction W of multilayer ceramic capacitor 3 is referred to as X direction, the direction parallel to longitudinal direction L of multilayer ceramic capacitor 3 is referred to as Y direction, and the direction parallel to thickness direction T of multilayer ceramic capacitor 3 is referred to as Z direction.

As shown in FIG. 4, thickness meter 150 in the present preferred embodiment includes an irradiation unit 150a and a reception unit 150b. Irradiation unit 150a includes a first laser oscillation source 151, a second laser oscillation source 152, a half mirror 153, and a projection lens 154. Reception unit 150b includes a reception lens 155 and a high dynamic range camera 156.

Regarding irradiation unit 150a, an electromagnetic wave emitted from first laser oscillation source 151 and an electromagnetic wave emitted from second laser oscillation source 152 are each a linearly polarized wave having a certain direction of polarization. The direction of polarization of the electromagnetic wave emitted from first laser oscillation source 151 and the direction of polarization of the electromagnetic wave emitted from second laser oscillation source 152 differ from each other. In the present preferred embodiment, the direction of polarization of the electromagnetic wave emitted from first laser oscillation source 151 and the direction of polarization of the electromagnetic wave emitted from second laser oscillation source 152 differ from each other by 90° or about 90°, for example. The difference in direction of polarization therebetween, however, is not limited to 90°.

The electromagnetic wave emitted from first laser oscillation source 151 is a p-polarized wave with the direction of oscillation of the electromagnetic field parallel to the reflection surface of half mirror 153, and is therefore transmitted through the reflection surface to enter projection lens 154. The electromagnetic wave having entered projection lens 154 is shaped to spread in the form of a fan, and emitted to the outside of thickness meter 150.

The electromagnetic wave emitted from second laser oscillation source 152 is an s-polarized wave with the direction of oscillation of the electromagnetic field perpendicular to the reflection surface of half mirror 153, and is therefore reflected at an angle of 90° from the reflection surface to enter projection lens 154. The electromagnetic wave having entered projection lens 154 is shaped to spread in the form of a fan, and emitted to the outside of thickness meter 150.

As shown in FIGS. 4 and 5, an incident wave 180 applied from irradiation unit 150a of thickness meter 150 is incident from obliquely above onto multilayer ceramic capacitor 3 and transparent plate 110 on which multilayer ceramic capacitor 3 is mounted. Incident wave 180 which is incident at an angle of incidence θ is reflected at an angle of reflection θ to reach reception unit 150b. For example, the angle of incidence θ and the angle of reflection θ are each preferably about 22.5°. Thus, thickness meter 150 makes a so-called observation of specular reflection.

In reception unit 150b, a reflected wave 182 having passed through reception lens 155 enters high dynamic range camera 156 including a CMOS (Complementary Metal-Oxide Semiconductor) sensor. An image photographed by high dynamic range camera 156 has more information about the grayscale from the darkest portion to the brightest portion.

Figure 6:
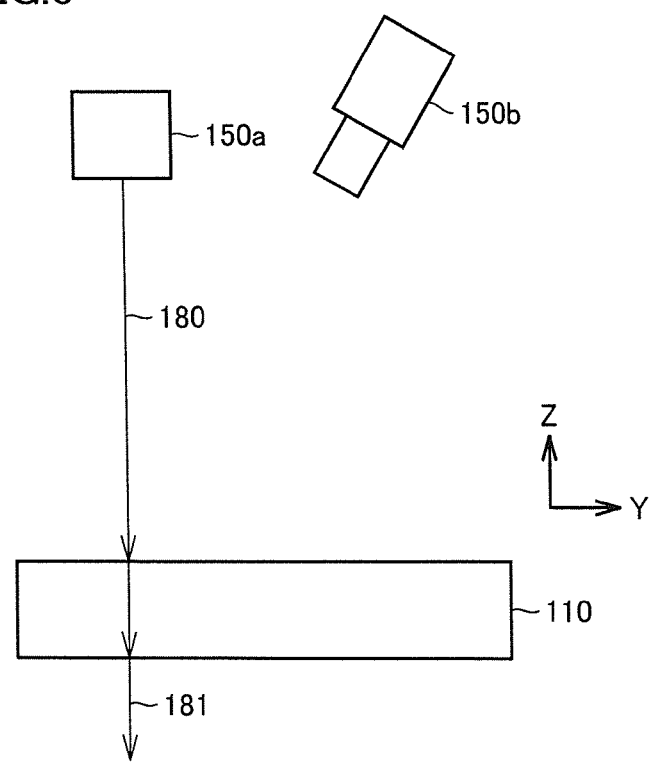
FIG. 6 is a side view showing the direction in which an electromagnetic wave travels in the case where an observation of diffuse reflection is made.
Figure 7:
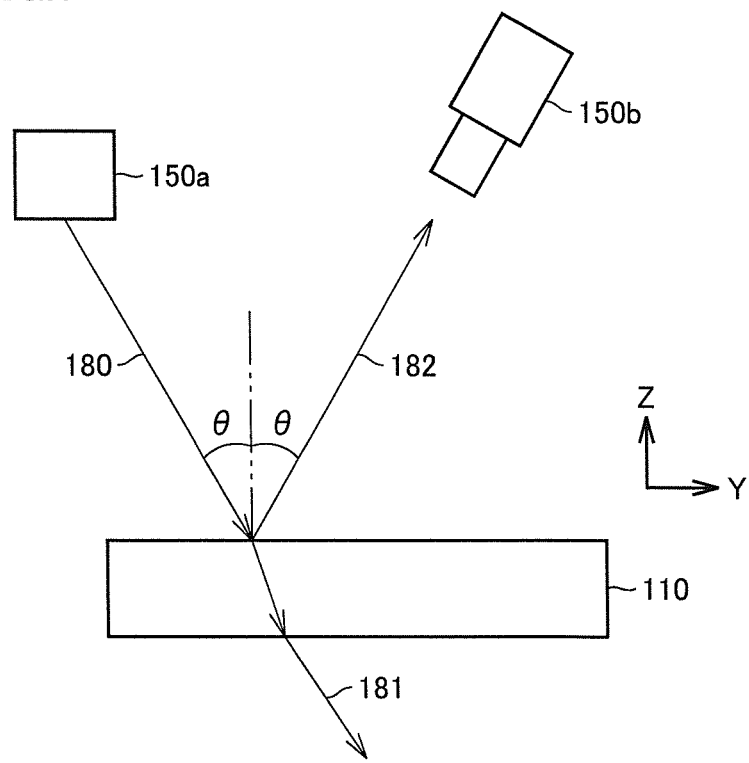
FIG. 7 is a side view showing the direction in which an electromagnetic wave travels in the case where an observation of specular reflection is made.

Here, a description will be made of the reason why an observation of specular reflection is made for the method of measuring the thickness of multilayer ceramic capacitor 3 in the present preferred embodiment. FIG. 6 is a side view showing the direction in which an electromagnetic wave travels when an observation of diffuse reflection is made. FIG. 7 is a side view showing the direction in which an electromagnetic wave travels in the case where an observation of specular reflection is made.

In order for thickness meter 150 to measure the thickness of multilayer ceramic capacitor 3 via the light section method, it is necessary to receive the reflected wave reflected from the upper surface of multilayer ceramic capacitor 3 and the reflected wave reflected from the upper surface of transparent plate 110.

As shown in FIG. 6, if incident wave 180 is applied from irradiation unit 150a in the direction perpendicular or substantially perpendicular to the upper surface of transparent plate 110, incident wave 180 is entirely transmitted through transparent plate 110 to become a transmitted wave 181. It is therefore impossible for reception unit 150b to receive the reflected wave reflected from the upper surface of transparent plate 110.

As shown in FIG. 7, if incident wave 180 is applied from irradiation unit 150a toward the upper surface of transparent plate 110 at an angle of incidence θ(θ≠0°), a portion of incident wave 180 is transmitted through transparent plate 110 to become a transmitted wave 181. Meanwhile, another portion of incident wave 180 is reflected at an angle of reflection θ to become a reflected wave 182. Thus, reception unit 150b preferably is disposed at a position where reflected wave 182 is incident, to thus receive reflected wave 182 reflected from the upper surface of transparent plate 110.

In the case where an observation of specular reflection is made, however, the intensity of the reflected wave reflected from the upper surface of multilayer ceramic capacitor 3 is significantly lower than the intensity of the reflected wave reflected from the upper surface of transparent plate 110. Moreover, in the case where an observation of specular reflection is made, multi-reflection occurs in transparent plate 110.

Figure 8:
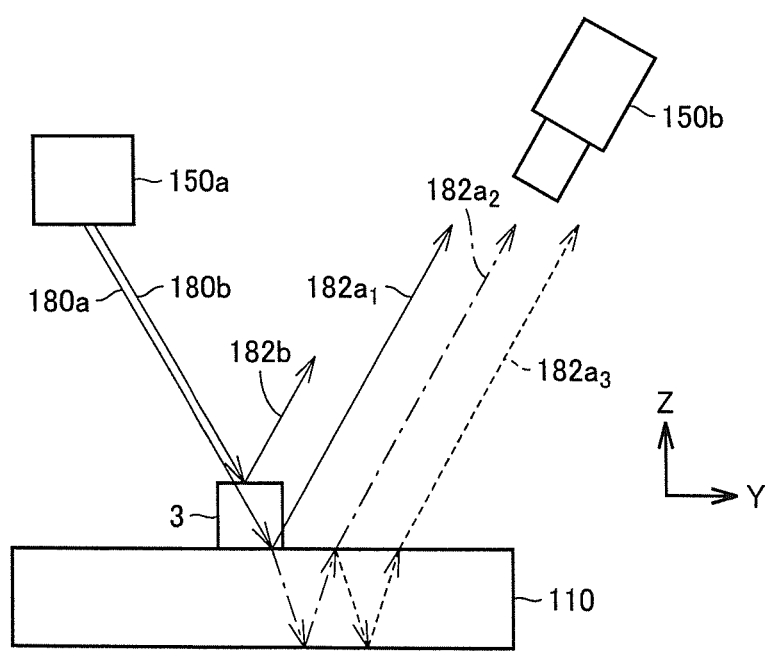
FIG. 8 is a side view showing the directions in which electromagnetic waves travel in the case where multi-reflection is caused in a transparent plate.

FIG. 8 is a side view showing the directions in which electromagnetic waves travel in the case where multi-reflection is caused in the transparent plate. In FIG. 8, reflected waves reflected inside transparent plate 110 are shown as two reflected waves by way of example.

As shown in FIG. 8, a portion of incident wave 180a applied from irradiation unit 150a is reflected from the upper surface of transparent plate 110 to become a reflected wave 182$a_1$. Another portion of incident wave 180a applied from irradiation unit 150a is refracted at the upper surface of transparent plate 110 to enter transparent plate 110, reflected from the lower surface of transparent plate 110, and thereafter refracted at the upper surface of transparent plate 110 to be emitted from transparent plate 110 and become a reflected wave 182$a_2$. Still another portion of incident wave 180a applied from irradiation unit 150a is refracted at the upper surface of transparent plate 110 to enter transparent plate 110, reflected from the lower surface of transparent plate 110, thereafter reflected from the upper surface of transparent plate 110, reflected again from the lower surface of transparent plate 110, and finally refracted at the upper surface of transparent plate 110 to be emitted from transparent plate 110 and become a reflected wave 182$a_3$.

An incident wave 180b applied from irradiation unit 150a is reflected from the upper surface of multilayer ceramic capacitor 3 to become a reflected wave 182b. The intensity of reflected wave 182b is significantly lower than the intensity of reflected wave 182a1.

Reception unit 150b has high dynamic range camera 156 as described above and can therefore receive reflected wave 182$a_1$, reflected wave 182$a_2$, reflected wave 182$a_3$, and reflected wave 182b to form image data indicating respective intensity peaks of the reflected waves.

Figure 9:
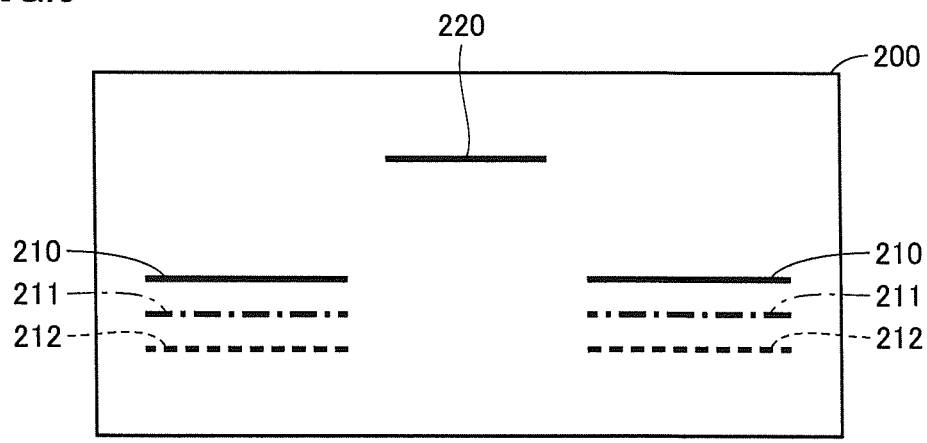
FIG. 9 is a diagram showing image data photographed by a high dynamic range camera of a reception unit.

FIG. 9 is a diagram showing image data photographed by the high dynamic range camera of the reception unit. As shown in FIG. 9, image data 200 photographed by high dynamic range camera 156 includes a first reference line 220 representing the intensity peak of reflected wave 182b reflected from the upper surface of multilayer ceramic capacitor 3, a second reference line 210 representing the intensity peak of reflected wave 182$a_1$ reflected from the upper surface of transparent plate 110, a second reference line 211 representing the intensity peak of reflected wave 182$a_2$ reflected from the lower surface of transparent plate 110, and a second reference line 212 representing the intensity peak of reflected wave 182$a_3$ reflected three times in transparent plate 110.

Image data 200 photographed by high dynamic range camera 156 includes a first reference line representing the intensity peak of the reflected wave reflected from the upper surface of multilayer ceramic capacitor 3 as well as a plurality of second reference lines representing respective intensity peaks of a plurality of reflected waves reflected from transparent plate 110.

In FIG. 9, second reference line 210, second reference line 211, and second reference line 212 are spaced from each other so that they are clearly distinguishable from each other. In the case, however, where the thickness of transparent plate 110 is as thin as on the order of about 5.0 mm or less, for example, the second reference lines are closer to each other and thus the boundaries therebetween are indefinite. In this case, it is difficult to extract only the second reference line 210 from a plurality of second reference lines. In some cases, it may be difficult to accurately detect the position of the upper surface of transparent plate 110 which serves as a reference to measure the thickness of multilayer ceramic capacitor 3.

In the above cases, thickness meter 150 alternately applies electromagnetic waves which are different from each other indirection of polarization, to thus accurately detect the position of the upper surface of transparent plate 110 serving as a reference to measure the thickness of multilayer ceramic capacitor 3. In the present preferred embodiment, irradiation unit 150a of thickness meter 150 alternately applies p-polarized wave and s-polarized wave.

Figure 10:
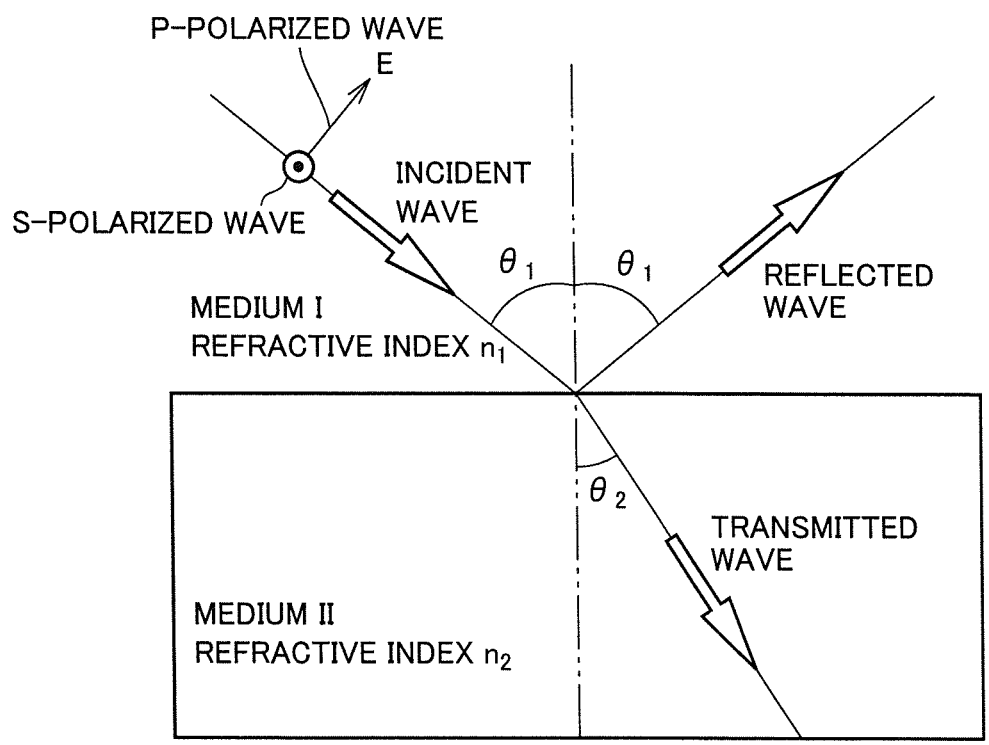
FIG. 10 is a diagram for illustrating the Fresnel equations.

Here, a description will be made of a difference in reflection coefficient at transparent plate 110, between a p-polarized wave and an s-polarized wave. FIG. 10 is a diagram for illustrating the Fresnel equations. As shown in FIG. 10, a p-polarized wave and an s-polarized wave propagate in a medium I, a portion thereof is reflected from the interface between medium I and a medium II, and another portion thereof is refracted at the interface and transmitted in medium II. The refractive index of medium I is $n_1$, the refractive index of medium II is $n_2$, the angle of incidence and the angle of reflection are each $\theta_1$, and the angle of refraction is $\theta_2$.

Based on the Snell's law, the relation $n_1 \sin \theta_1 = n_2 \sin \theta_2$ holds. Here, the relation between the refractive indices, namely the relative refractive index $n=n_2/n_1$ holds. Further, based on the Fresnel equations, the reflection coefficient Rp of the energy of the p-polarized wave is represented by the following equation (1) and the reflection coefficient Rs of the energy of the s-polarized wave is represented by the following equation (2).

$$Rp = \left( \frac{n^2 \cos\theta_1 - \sqrt{n^2 - \sin^2\theta_1}}{n^2 \cos\theta_1 + \sqrt{n^2 - \sin^2\theta_1}} \right)^2 \quad (1)$$

$$Rs = \left( \frac{\cos\theta_1 - \sqrt{n^2 - \sin^2\theta_1}}{\cos\theta_1 + \sqrt{n^2 - \sin^2\theta_1}} \right)^2 \quad (2)$$

In the present preferred embodiment, medium I is air and refractive index $n_1$ of medium I is approximately 1.0. for example. Medium II is glass and refractive index $n_2$ of medium II is approximately 1.5, for example. Relative refractive index n is therefore approximately 1.5, for example.

Figure 11:
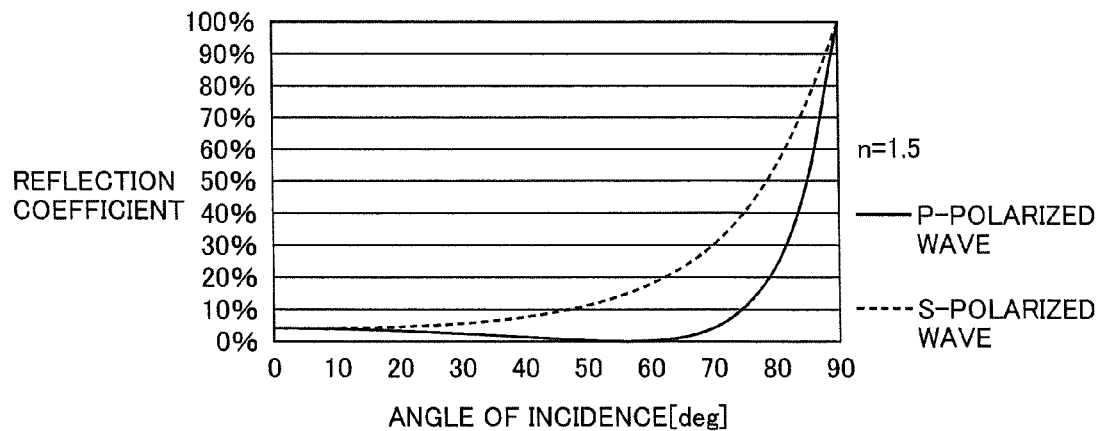
FIG. 11 is a graph showing a relationship between respective reflection coefficients and the angle of incidence of a p-polarized wave and an s-polarized wave entering a glass plate from air.

From the equations (1) and (2) above, the relation between the reflection coefficients of the p-polarized wave and the s-polarized wave and the angle of incidence is derived. FIG. 11 is a graph showing a relationship between respective reflection coefficients and the angle of incidence of a p-polarized wave and an s-polarized wave entering a glass plate from air. Table 1 shows a difference between the reflection coefficient of the p-polarized wave and the reflection coefficient of the s-polarized wave for each of different angles of incidence. In FIG. 11, the vertical axis represents the reflection coefficient (%) and the horizontal axis represents the angle of incidence (°). The p-polarized wave is represented by a solid line and the s-polarized wave is represented by a dotted line.

TABLE 1

| angle of incidence (°) | reflection coefficient of p-polarized wave (%) | reflection coefficient of s-polarized wave (%) | difference in reflection coefficient between p-polarized wave and s-polarized wave (%) |
|---|---|---|---|
| 0 | 4.0 | 4.0 | 0.0 |
| 5 | 4.0 | 4.0 | 0.1 |
| 10 | 3.8 | 4.2 | 0.3 |
| 12 | 3.8 | 4.2 | 0.5 |
| 15 | 3.6 | 4.4 | 0.8 |
| 20 | 3.3 | 4.7 | 1.4 |
| 22.5 | 3.2 | 4.9 | 1.7 |
| 25 | 3.0 | 5.2 | 2.2 |
| 30 | 2.5 | 5.8 | 3.3 |
| 35 | 2.0 | 6.6 | 4.6 |
| 40 | 1.4 | 7.7 | 6.3 |
| 42.5 | 1.1 | 8.4 | 7.3 |
| 43 | 1.1 | 8.6 | 7.5 |
| 43.5 | 1.0 | 8.7 | 7.7 |
| 45 | 0.8 | 9.2 | 8.4 |
| 50 | 0.3 | 11.2 | 10.9 |
| 55 | 0.0 | 13.9 | 13.9 |
| 60 | 0.2 | 17.7 | 17.5 |
| 65 | 1.3 | 22.8 | 21.5 |
| 70 | 4.2 | 30.0 | 25.7 |
| 75 | 10.7 | 39.9 | 29.3 |
| 80 | 23.7 | 53.9 | 30.2 |
| 85 | 49.3 | 73.2 | 23.9 |
| 90 | 100.0 | 100.0 | 0.0 |

As shown in FIG. 11, in a range of angle of incidence $\theta_1$ of 0° or more and 90° or less, the reflection coefficient of the s-polarized wave is equivalent to or higher than the reflection coefficient of the p-polarized wave. The reflection coefficient of the p-polarized wave includes a reflection coefficient of less than about 1% at certain angles of incidence $\theta_1$.

In the present preferred embodiment, in order to accurately detect, from an image photographed by the high dynamic range camera, the position of the upper surface of transparent plate 110 which serves as a reference for measuring the thickness of multilayer ceramic capacitor 3, it is necessary to ensure a reflection coefficient of about 1% or more. It is also necessary to have a significant difference between the reflection coefficient of the s-polarized wave and the reflection coefficient of the p-polarized wave.

As shown in Table 1, the ranges where the reflection coefficient of the p-polarized wave is about 1% or more correspond to the range of the angle of incidence of 0° or more and about 43.5° or less and the range of the angle of incidence of about 65° or more and about 90° or less. The range where the reflection coefficient of the s-polarized wave and the reflection coefficient of the p-polarized wave have a significant difference therebetween corresponds to the range of the angle of incidence of about 10° or more and about 85° or less, for example.

Further, because the resolution of image processing is limited, it is necessary, in order to extract a reflected wave which is reflected from the upper surface of transparent plate 110, from a plurality of reflected waves reflected from transparent plate 110 having a thickness of about 1.2 mm, that angle of incidence $\theta_1$ be smaller than about 65°, for example. Namely, if angle of incidence $\theta_1$ is about 65° or more, second reference line 210, second reference line 211, and second reference line 212 are closer to each other and accordingly overlap each other in image data 200 photographed by high dynamic range camera 156 as described above.

In view of the above conditions, angle of incidence $\theta_1$ of the s-polarized wave and the p-polarized wave applied from irradiation unit 150a of thickness meter 150 is preferably about 10° or more and about 43.5° or less, for example. The thickness of transparent plate 110 is preferably about 1.2 mm or more, for example.

In the following, a description will be made of a method for measuring the thickness of multilayer ceramic capacitor 3 by thickness meter 150 according to the present preferred embodiment. Thickness meter 150 applies a p-polarized wave, which is a first electromagnetic wave, to external electrode 2 of multilayer ceramic capacitor 3 as shown in FIG. 5, and the reflected wave is photographed by the high dynamic range camera. Immediately after this, thickness meter 150 applies an s-polarized wave, which is a second electromagnetic wave, to external electrode 2 of multilayer ceramic capacitor 3, and the reflected wave is photographed by the high dynamic range camera. It should be noted that the s-polarized wave may be applied prior to application of the p-polarized wave.

The rotational speed of transparent plate 110 is preferably set to, for example, about 100 mm/sec. The time taken for the high dynamic range camera to perform one photographing operation preferably is set to, for example, about 240 μsec. Thus, the s-polarized wave and the p-polarized wave are applied to almost the same position of multilayer ceramic capacitor 3.

The wavelength of incident wave 180 which is the s-polarized wave or p-polarized wave preferably is about 400 nm or more and about 500 nm or less, for example. Namely, incident wave 180 is blue light. The blue light having a short wavelength is used to enable measurements to be taken with high precision. In the present preferred embodiment, incident wave 180 is shaped in the form of a fan spreading in the X direction.

As shown in FIG. 4, thickness meter 150 receives reflected wave 182 of incident wave 180 via reception unit 150b and photographs reflected wave 182 via high dynamic range camera 156.

Figure 12:
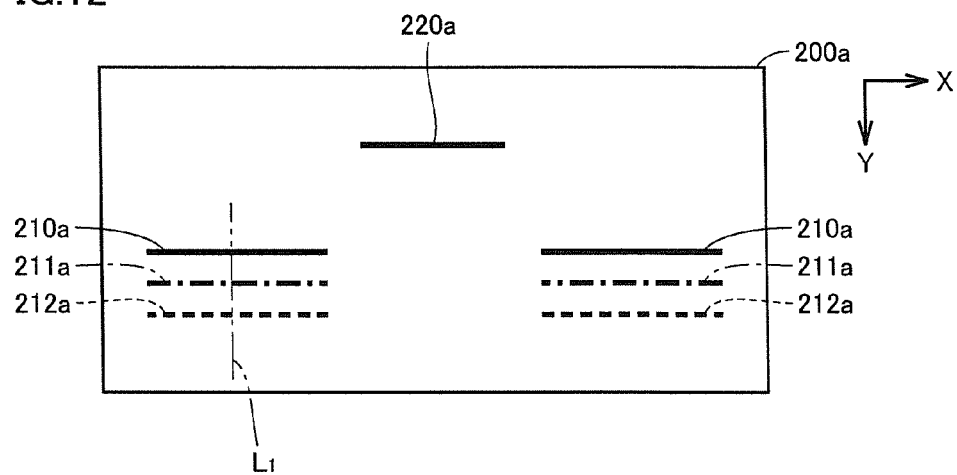
FIG. 12 is a diagram showing first image data obtained by photographing reflected waves of a p-polarized wave via a high dynamic range camera.
Figure 13:
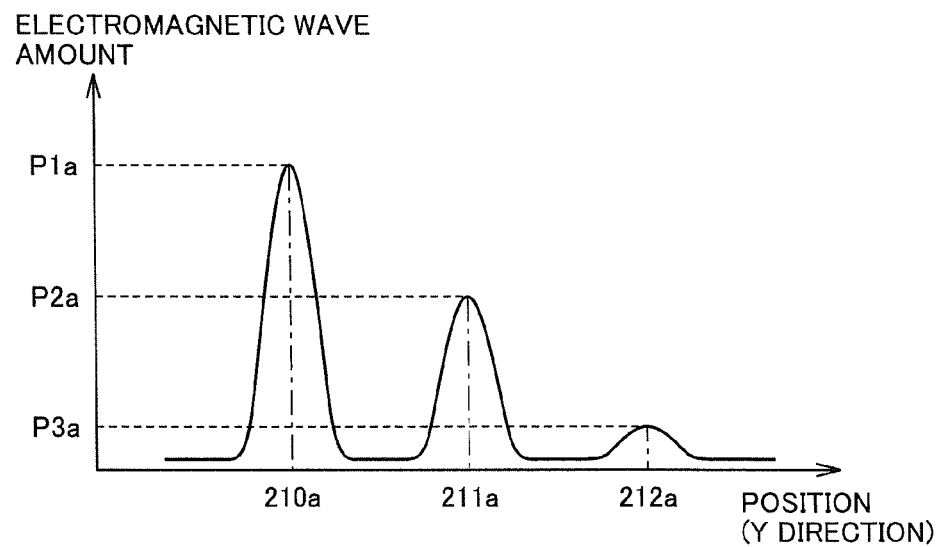
FIG. 13 is a diagram showing a distribution of the amount of electromagnetic waves on a line $L_1$ in FIG. 12.
Figure 14:
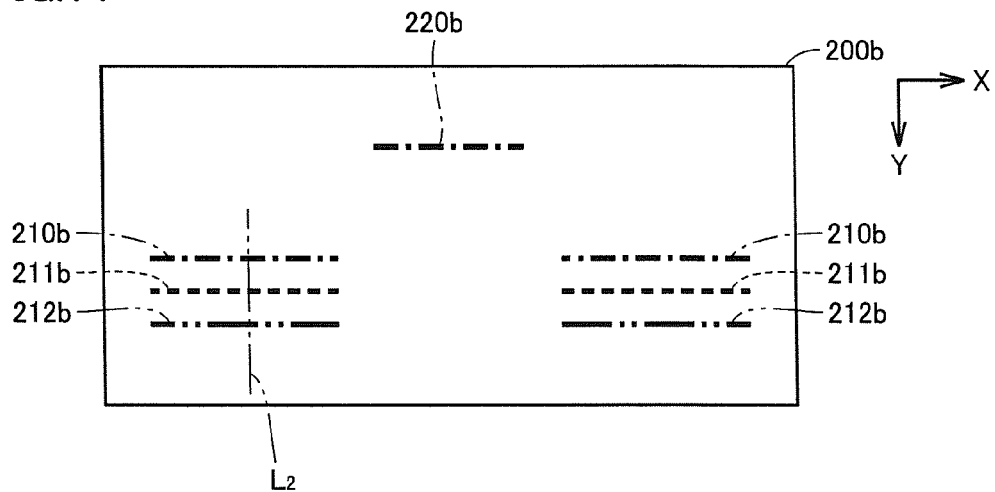
FIG. 14 is a diagram showing second image data obtained by photographing reflected waves of an s-polarized wave via a high dynamic range camera.
Figure 15:
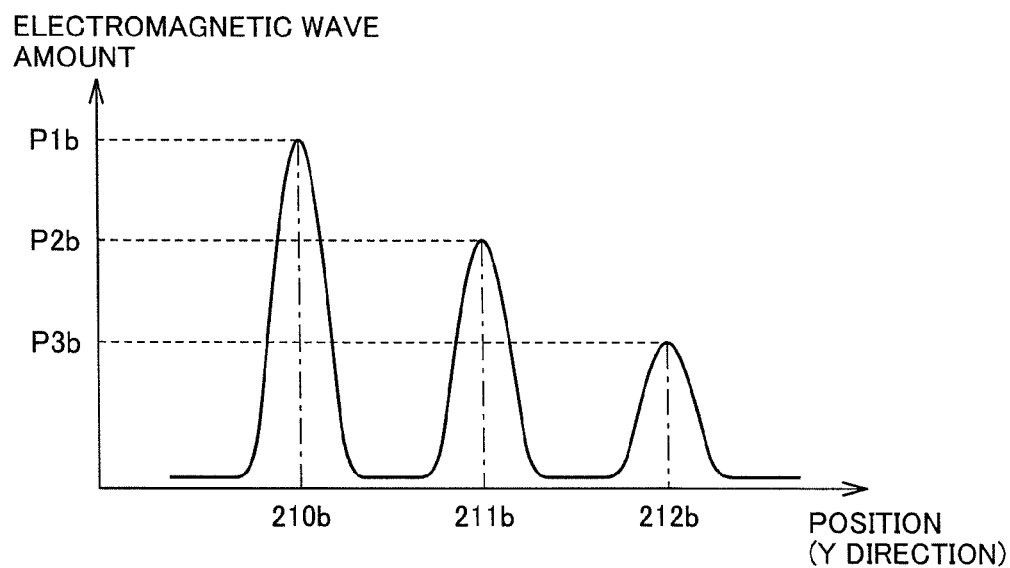
FIG. 15 is a diagram showing a distribution of the amount of electromagnetic waves on a line $L_2$ in FIG. 14.

FIG. 12 is a diagram showing first image data obtained by photographing reflected waves of a p-polarized wave via a high dynamic range camera. FIG. 13 is a diagram showing a distribution of the amount of electromagnetic waves on a line $L_1$ in FIG. 12. FIG. 14 is a diagram showing second image data obtained by photographing reflected waves of an s-polarized wave via a high dynamic range camera. FIG. 15 is a diagram showing a distribution of the amount of electromagnetic waves on a line $L_2$ in FIG. 14. In FIGS. 13 and 15 each, the vertical axis represents the electromagnetic wave amount and the horizontal axis represents the position along the Y direction.

As shown in FIG. 12, first image data 200a obtained by photographing the reflected waves of the p-polarized wave via high dynamic range camera 156 includes a first reference line 220a representing the intensity peak of reflected wave 182b reflected from the upper surface of multilayer ceramic capacitor 3, a second reference line 210a representing the intensity peak of reflected wave $182a_1$ reflected from the upper surface of transparent plate 110, a second reference line 211a representing the intensity peak of reflected wave $182a_2$ reflected from the lower surface of transparent plate 110, and a second reference line 212a representing the intensity peak of reflected wave $182a_3$ reflected three times in transparent plate 110.

As shown in FIG. 13, the distribution of the electromagnetic wave amount of the reflected waves of the p-polarized wave reflected from transparent plate 110 exhibits attenuation and decrease with increase of the number of multi-reflections. Specifically, the electromagnetic wave amount of the reflected waves of the p-polarized wave is a highest amount of P1a on second reference line 210a, P2a on second reference line 211a is smaller than P1a, and P3a on second reference line 212a is smaller than P2a.

As shown in FIG. 14, second image data 200b obtained by photographing the reflected waves of the s-polarized wave via high dynamic range camera 156 includes a first reference line 220b representing the intensity peak of reflected wave 182b reflected from the upper surface of multilayer ceramic capacitor 3, a second reference line 210b representing the intensity peak of reflected wave $182a_1$ reflected from the upper surface of transparent plate 110, a second reference line 211b representing the intensity peak of reflected wave $182a_2$ reflected from the lower surface of transparent plate 110, and a second reference line 212b representing the intensity peak of reflected wave $182a_3$ reflected three times in transparent plate 110.

As shown in FIG. 15, the distribution of the electromagnetic wave amount of the reflected waves of the s-polarized wave reflected from transparent plate 110 exhibits attenuation and decrease with increase of the number of multi-reflections. Specifically, the electromagnetic wave amount of the reflected waves of the p-polarized wave is a highest amount of P1b on second reference line 210b, P2b on second reference line 211b is smaller than P1b, and P3b on second reference line 212b is smaller than P2b.

As shown in FIGS. 13 and 15, the p-polarized wave is larger than the s-polarized wave in terms of the rate of decrease of the electromagnetic wave amount. This is for the following reason. Namely, due to the lower reflection coefficient of the p-polarized wave than that of the s-polarized wave, the difference in reflection coefficient between the p-polarized wave and the s-polarized wave is progressively increased with increase of the number of reflections.

Thickness meter 150 utilizes the aforementioned difference in rate of decrease of the electromagnetic wave amount between the p-polarized wave and the s-polarized wave to extract only the second reference line of the reflected wave which is reflected from the upper surface of transparent plate 110. Thus, thickness meter 150 extracts, from a plurality of second reference lines in first image data 200a and a plurality of second reference lines in second image data 200b, only a second reference line at which the difference in intensity peak between respective second reference lines at the same position in the first image data and the second image data is smallest.

Specifically, thickness meter 150 calculates a difference (P1b–P1a) between the amount of electromagnetic wave on second reference line 210b and the amount of electromagnetic wave on second reference line 210a. Thickness meter 150 also calculates a difference (P2b–P2a) between the amount of electromagnetic wave on second reference line 211b and the amount of electromagnetic wave on second reference line 211a. Thickness meter 150 also calculates a difference (P3b–P3a) between the amount of electromagnetic wave on second reference line 212b and the amount of electromagnetic wave on second reference line 212a.

As described above, the rate of decrease of the electromagnetic wave amount of the p-polarized wave is larger than that of the s-polarized wave, and accordingly (P1b–P1a)<(P2b–P2a)<(P3b–P3a) holds. Thickness meter 150 extracts, from a plurality of second reference lines, only the second reference line 210 at which the difference in electromagnetic wave amount between the p-polarized wave and the s-polarized wave is smallest.

Figure 16:
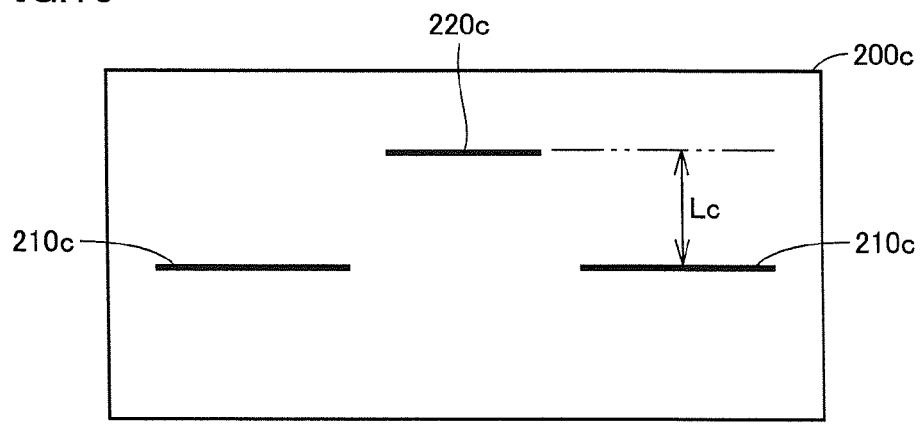
FIG. 16 is a diagram showing third image data formed after a second reference line is extracted.

FIG. 16 is a diagram showing third image data formed after the second reference line is extracted. As shown in FIG. 16, third image data 200c includes a first reference line 220c representing the intensity peak of reflected wave 182b reflected from the upper surface of multilayer ceramic capacitor 3, and a second reference line 210c representing the intensity peak of reflected wave $182a_1$ reflected from the upper surface of transparent plate 110 that is extracted from a plurality of second reference lines.

Thickness meter 150 corrects the numerical value of a distance Lc between first reference line 220c and second reference line 210c in third image data 200c to calculate the thickness of multilayer ceramic capacitor 3. Specifically, in accordance with angle of incidence $\theta_1$ of incident wave 180, thickness meter 150 corrects the numerical value of distance Lc.

In this way, only the second reference line 210 is extracted from a plurality of second reference lines to enable accurate detection of the position of the upper surface of transparent plate 110 which serves as a reference to measure the thickness of multilayer ceramic capacitor 3. Accordingly, the thickness of multilayer ceramic capacitor 3 mounted on transparent plate 110 is accurately measured via the light section method.

Figure 17:
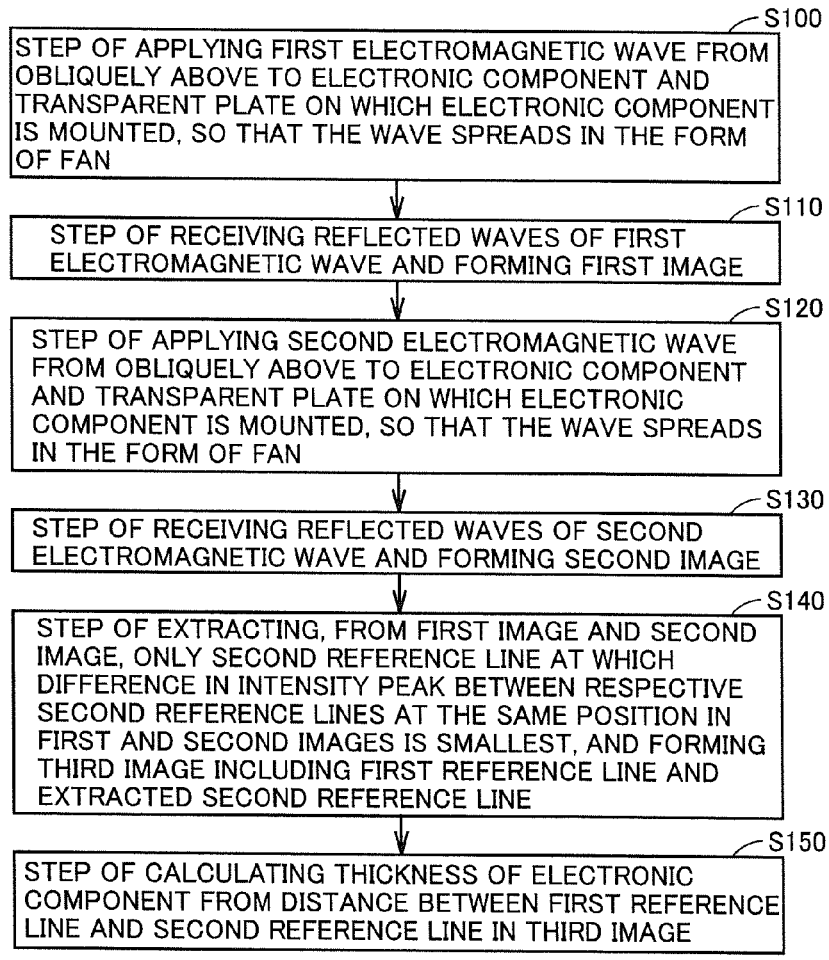
FIG. 17 is a flowchart showing an electronic component thickness measurement method according to the first preferred embodiment of the present invention.

FIG. 17 is a flowchart showing an electronic component thickness measurement method according to the present preferred embodiment. As shown in FIG. 17, the electronic component thickness measurement method in the present preferred embodiment includes the step of applying a first electromagnetic wave from obliquely above to an electronic component and transparent plate 110 on which the electronic component is mounted, so that the first electromagnetic wave spreads in the form of a fan (S100); the step of receiving reflected waves of the first electromagnetic wave and forming first image data 200a including a first reference line 220a representing an intensity peak of a reflected wave reflected from an upper surface of the electronic component and a plurality of second reference lines representing respective intensity peaks of a plurality of reflected waves reflected from transparent plate 110 (S110); the step of applying a second electromagnetic wave, which is different from the first electromagnetic wave in direction of polarization, from obliquely above and at the same angle as the first electromagnetic wave, to a position on the electronic component and transparent plate 110 identical or substantially identical to a position to which the first electromagnetic wave is applied, so that the second electromagnetic wave spreads in the form of a fan (S120); and the step of receiving reflected waves of the second electromagnetic wave and thus forming second image data 200b including a first reference line 220b representing an intensity peak of a reflected wave reflected from the upper surface of the electronic component and a plurality of second reference lines representing respective intensity peaks of a plurality of reflected waves reflected from the transparent plate (S130).

The electronic component thickness measurement method also includes the step of extracting, from the plurality of second reference lines in the first image data 200a and the plurality of second reference lines in the second image data 200b, only a second reference line at which a difference in intensity peak between respective second reference lines at the same position in the first image data and the second image data is smallest, and thus forming third image data 200c including the first reference line 220c and the extracted second reference line 210c (S140); and the step of calculating the thickness of the electronic component from a distance Lc between the first reference line 220c and the second reference line 210c in the third image data 200c (S150).

The electronic component thickness measurement method including the above-described steps according to the present preferred embodiment enables the thickness of the electronic component mounted on transparent plate 110 to be measured accurately via the light section method.

It should be noted that the p-polarized wave and the s-polarized wave may be applied to one electronic component multiple times. Specifically, each of the step of applying the first electromagnetic wave (S100), the step of forming the first image data (S110), the step of applying the second electromagnetic wave (S120), the step of forming the second image data (S130), the step of forming the third image data (S140), and the step of calculating the thickness of the electronic component (S150) may be performed for positions on one electronic component that are different from each other.

Respective measurements of the thickness can thus be taken at different portions of an electronic component to thus select the maximum measurement of the thickness from the taken measurements. Accordingly, the measurement can be made close to the maximum thickness of the electronic component.

In the following, a description will be made of the results of comparison between the thickness of multilayer ceramic capacitor 3 measured by applying a p-polarized wave and an s-polarized wave multiple times in an Example and the thickness of multilayer ceramic capacitor 3 measured via a micrometer.

Specifically, respective thicknesses of six types of multilayer ceramic capacitors 3 preferably having a length of about 1.0 mm and a width of about 0.5 mm and different in thickness from each other were measured via both the aforementioned methods. For each type, 10 multilayer ceramic capacitors 3 were prepared. In the Example, the p-polarized wave was applied 30 times and the s-polarized wave was applied 30 times to one multilayer ceramic capacitor 3, and the maximum value was selected from the resultant measurements.

Figure 18:
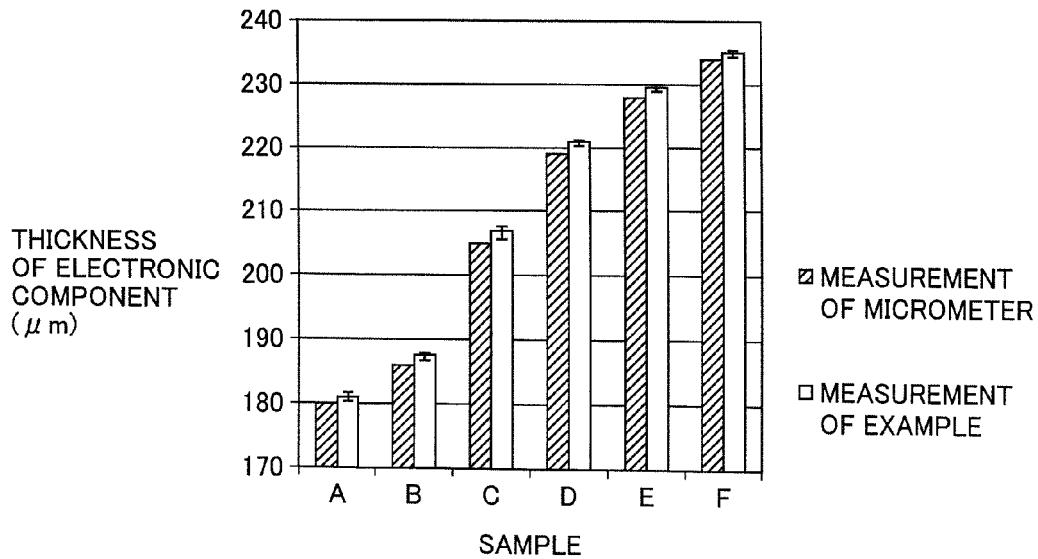
FIG. 18 is a graph where measurements in an Example and measurements taken by a micrometer are compared with each other.

FIG. 18 is a graph where the measurements of the Example and the measurements of the micrometer are compared with each other. In FIG. 18, the vertical axis represents the thickness (μm) of the electronic component and the types of samples are indicated along the horizontal axis. The measurements of the Example and the measurements of the micrometer are each an average of measurements of the thickness of 10 multilayer ceramic capacitors 3. Regarding the measurements of the Example, a range between the maximum value and the minimum value of the measurements of 10 multilayer ceramic capacitors 3 is indicated by an error bar.

As shown in FIG. 18, regarding all of samples A to F, the difference between the measurement of the Example and the measurement of the micrometer was about 2 μm or less. Regarding the measurements of the Example, the range between the maximum value and the minimum value of the measurements of the thickness of 10 multilayer ceramic capacitors 3 was also about 2 μm or less.

From the above results of comparison, it has been confirmed that the maximum thickness of multilayer ceramic capacitor 3 can be measured with a precision of a few μm by applying the p-polarized wave and the s-polarized wave multiple times, taking measurements of the thickness of multilayer ceramic capacitor 3, and selecting the maximum value from the measurements of the thickness.

Preferably, the p-polarized wave and the s-polarized wave are applied to a whole extent of multilayer ceramic capacitor 3 to thereby measure the thickness of multilayer ceramic capacitor 3. For example, in the case where an electromagnetic wave to be applied has a width (the electromagnetic wave's width in the longitudinal direction of multilayer ceramic capacitor 3) of about 35 μm, the electromagnetic wave is applied 29 times or more to multilayer ceramic capacitor 3 having a length of about 1.0 mm so that the electromagnetic wave can be applied to the whole extent in the longitudinal direction of multilayer ceramic capacitor 3. Namely, each of the p-polarized wave and the s-polarized wave can be applied 29 times or more to measure, with high precision, the maximum thickness of multilayer ceramic capacitor 3.

Further, preferably a portion of multilayer ceramic capacitor 3 irradiated with the electromagnetic wave and another portion thereof irradiated with the electromagnetic wave partially overlap each other. For example, a portion of multilayer ceramic capacitor 3 irradiated with the electromagnetic wave and another portion thereof irradiated subsequently with the electromagnetic wave overlap each other by approximately 10 μm in the longitudinal direction of multilayer ceramic capacitor 3. In this way, the maximum thickness of multilayer ceramic capacitor 3 can be measured with higher precision.

In the present preferred embodiment, incident wave 180 applied from thickness meter 150 has a length of approximately 10 mm on transparent plate 110, and therefore, the whole longitudinal extent of multilayer ceramic capacitor 3 may be irradiated with incident wave 180.

Figure 19:
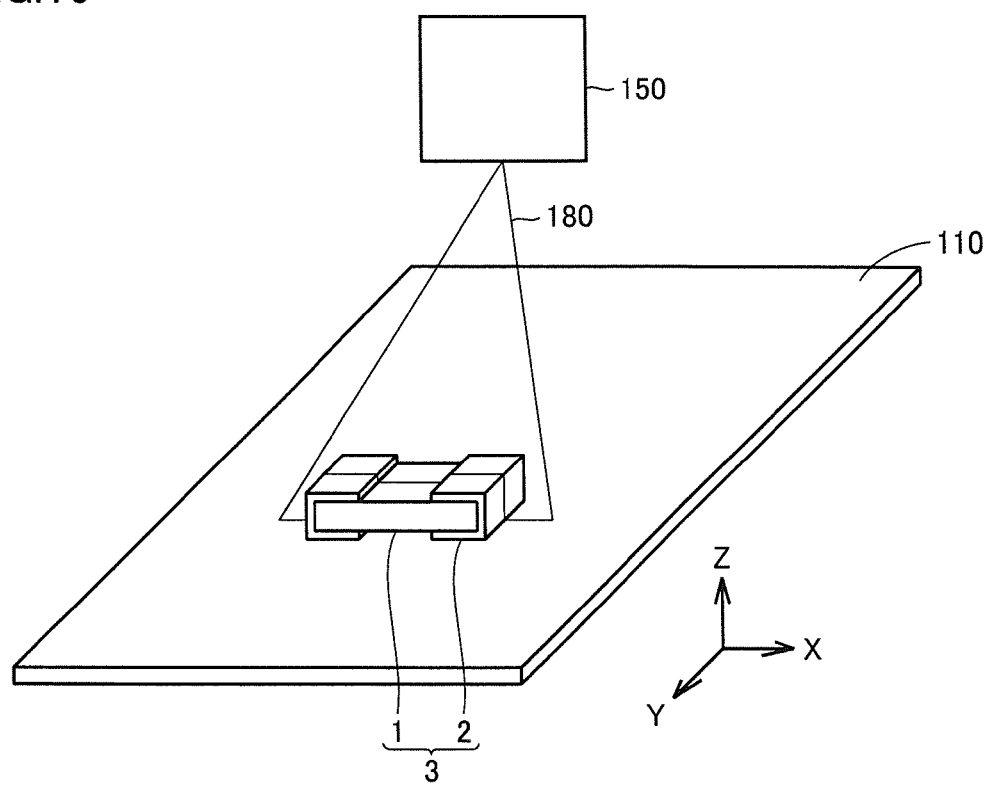
FIG. 19 is a perspective view showing a state where the whole longitudinal extent of a multilayer ceramic capacitor is irradiated with an incident wave.

FIG. 19 is a perspective view showing a state where the whole longitudinal extent of a multilayer ceramic capacitor is irradiated with an incident wave. As shown in FIG. 19, the whole longitudinal extent of multilayer ceramic capacitor 3 is irradiated with incident wave 180 so that each of two external electrodes 2 is irradiated with incident wave 180. In this way, the thickness of multilayer ceramic capacitor 3 can be measured precisely while the number of times the electromagnetic wave is applied is reduced.

Figure 20:
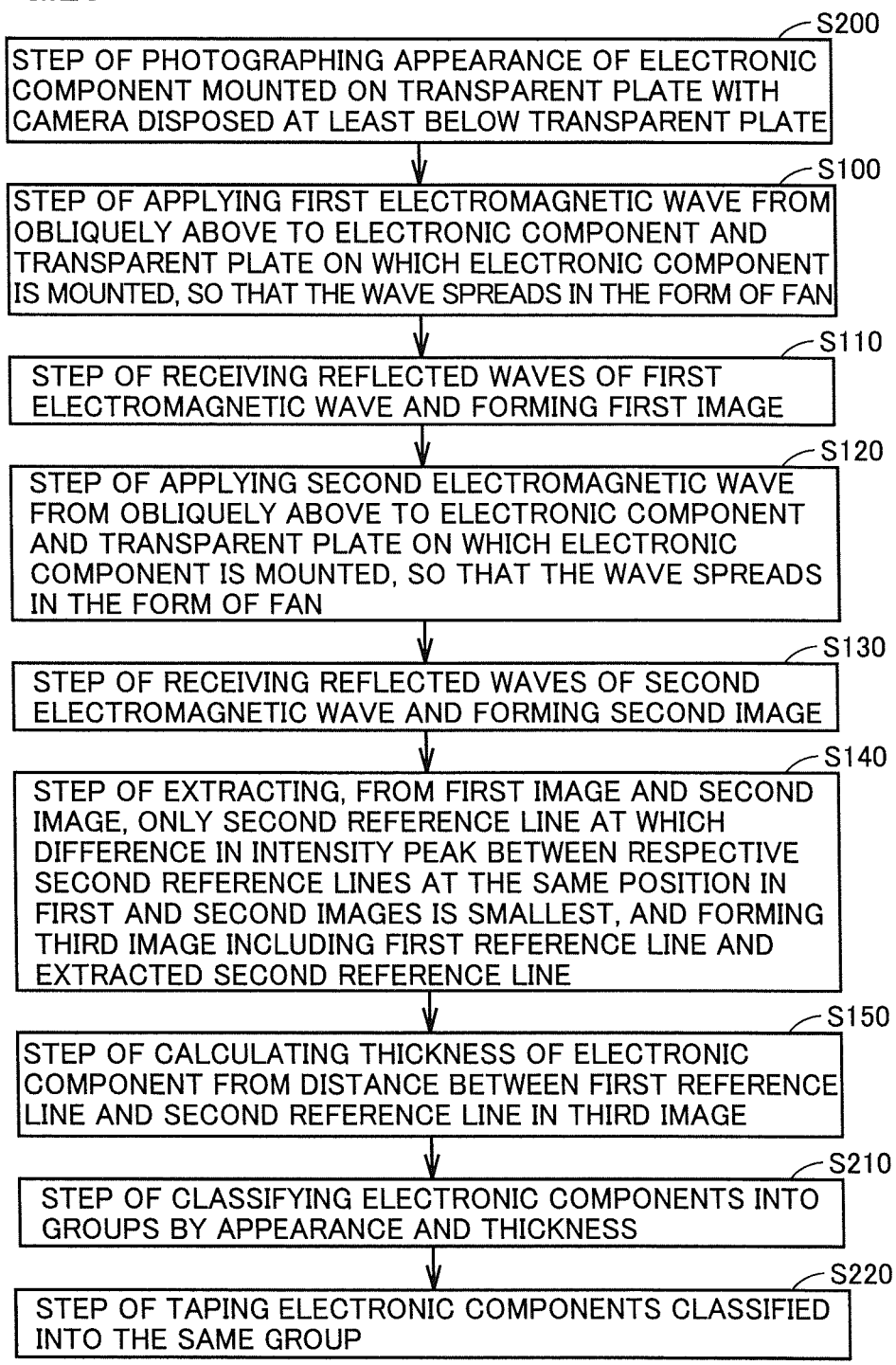
FIG. 20 is a flowchart showing a method for manufacturing a series of electronic components according to the first preferred embodiment of the present invention.
Figure 21:
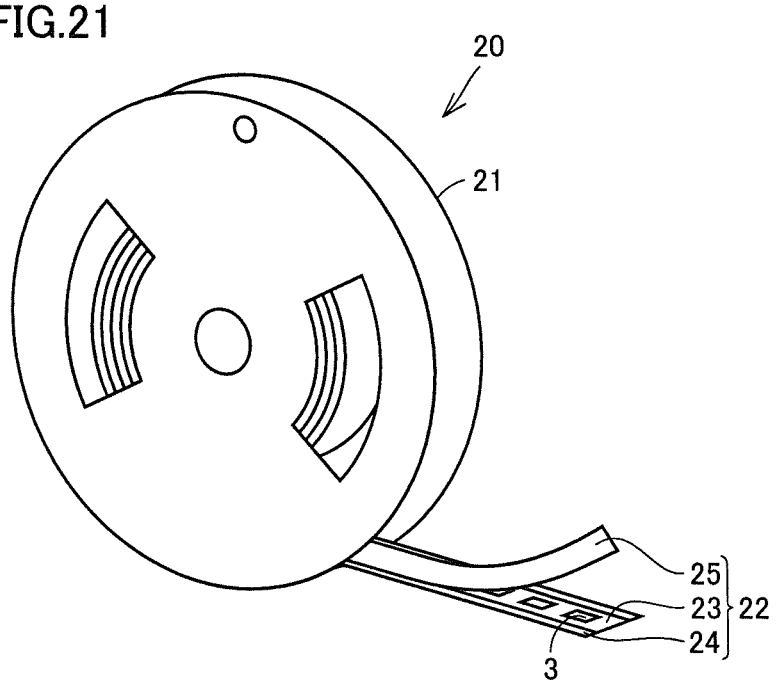
FIG. 21 is a perspective view showing an appearance of a series of electronic components which is taped.

In the following, a description will be made, with reference to the drawings, of a method for manufacturing a series of electronic components using the above-described electronic component thickness measurement method. FIG. 20 is a flowchart showing a method for manufacturing a series of electronic components according to the present preferred embodiment. FIG. 21 is a perspective view showing an appearance of a series of electronic components which is taped.

As shown in FIG. 20, the method for manufacturing a series of electronic components in the present preferred embodiment is a method for manufacturing a series of electronic components made up of a plurality of electronic components packaged into a single unit. The method for manufacturing a series of electronic components includes the step of photographing an appearance of an electronic component mounted on a transparent plate 110 via a photography device disposed at least below the transparent plate 110 (S200); the step of applying a first electromagnetic wave from obliquely above to the electronic component and the transparent plate 110 on which the electronic component is mounted, so that the first electromagnetic wave spreads in the form of a fan (S100); the step of receiving reflected waves of the first electromagnetic wave and thereby forming first image data 200a including a first reference line 220a representing an intensity peak of a reflected wave reflected from an upper surface of the electronic component and a plurality of second reference lines representing respective intensity peaks of a plurality of reflected waves reflected from transparent plate 110 (S110); the step of applying a second electromagnetic wave, which is different from the first electromagnetic wave in direction of polarization, from obliquely above and at the same angle as the first electromagnetic wave, to a position on the electronic component and transparent plate 110 identical or substantially identical to a position to which the first electromagnetic wave is applied, so that the second electromagnetic wave spreads in the form of a fan (S120); and the step of receiving reflected waves of the second electromagnetic wave and thus forming second image data 200b including a first reference line 220b representing an intensity peak of a reflected wave reflected from the upper surface of the electronic component and a plurality of second reference lines representing respective intensity peaks of a plurality of reflected waves reflected from the transparent plate (S130).

The method for manufacturing a series of electronic components also includes the step of extracting, from the plurality of second reference lines in the first image data 200a and the plurality of second reference lines in the second image data 200b, only a second reference line at which a difference in intensity peak between respective second reference lines at the same position in the first image data and the second image data is smallest, and thus forming third image data 200c including the first reference line 220c and the extracted second reference line 210c (S140); the step of calculating the thickness of the electronic component from a distance Lc between the first reference line 220c and the second reference line 210c in the third image data 200c (S150); the step of classifying a plurality of electronic components into a plurality of groups, according to the appearance of each electronic component photographed in the step of photographing and the thickness of each electronic component calculated in the step of calculating the thickness of the electronic component (S210); and the step of taping a plurality of electronic components classified into any one group of the plurality of groups (S220).

As described above, inspection apparatus 100 in the present preferred embodiment conducts an appearance inspection preferably using four cameras to photograph multilayer ceramic capacitor 3, for example. Inspection apparatus 100 also conducts a thickness inspection for multilayer ceramic capacitor 3 preferably by applying a p-polarized wave and an s-polarized wave to multilayer ceramic capacitor 3.

Inspection apparatus 100 uses a classification mechanism to classify into three groups a plurality of multilayer ceramic capacitors 3 according to the results of inspections. Specifically, the classification mechanism classifies a plurality of multilayer ceramic capacitors 3 into a first group of multilayer ceramic capacitors identified as non-defective in both the appearance inspection and the thickness inspection, a second group of multilayer ceramic capacitors identified as non-defective in the appearance inspection and defective in the thickness inspection, and a third group of multilayer ceramic capacitors identified as defective in the appearance inspection.

As shown in FIG. 21, only the multilayer ceramic capacitors 3 classified into the first group are taped and accordingly a series of electronic components 20 is manufactured. Specifically, a series of electronic components 20 includes a tape body 22 which is a packing member for packing multilayer ceramic capacitors 3, and a reel body 21 around which tape body 22 is wound.

Reel body 21 is made of a resin material and includes a core having a through hole along its axial center and a pair of disks radially extending respectively from the core's opposite ends in the axial direction.

Tape body 22 includes a carrier tape 23, a bottom tape 24, and a top tape 25. Carrier tape 23 is preferably made of paper or a resin and has through holes or recesses configured to receive multilayer ceramic capacitors 3.

Bottom tape 24 is made of paper or a resin. Top tape 25 is made of a resin. Bottom tape 24 and top tape 25 are bonded to each other with carrier tape 23 therebetween to seal multilayer ceramic capacitors 3 received in the through holes or recesses of carrier tape 23.

Tape body 22 is wound around the core and between the disks of reel body 21. The tape body is wound by a taping apparatus.

A series of electronic components 20 is manufactured in this way so that the series of electronic components 20 can be made up of only the electronic components having been identified as non-defective in both the appearance inspection and the thickness inspection. Accordingly, the series of electronic components 20 made up of only the multilayer ceramic capacitors 3 having no chips and no cracks and having a variation in thickness of within 10 µm can be manufactured. Namely, it is possible, among a plurality of multilayer ceramic capacitors 3 included in the series of electronic components 20, the difference in thickness between the thickest multilayer ceramic capacitor 3 and the thinnest multilayer ceramic capacitor 3 is about 10 µm or less, for example. In the present preferred embodiment, the thickness of the thickest electronic component among a plurality of multilayer ceramic capacitors 3 included in the series of electronic components 20 preferably is about 0.25 mm or less, for example.

In the first preferred embodiment, second reference line 210, second reference line 211, and second reference line 212 shown in FIG. 9 are close to each other and thus the boundaries therebetween are indefinite. In some cases, however, the boundaries between the second reference lines may be definite. In such cases, thickness meter 150 may not necessarily be required to alternately apply electromagnetic waves which are different from each other in direction of polarization. Namely, electromagnetic waves having the same direction of polarization are applied to an electronic component and a transparent plate to measure the thickness of the electronic component.

In the following, a description will be made, with reference to drawings, of an electronic component thickness measurement method according to a second preferred embodiment for measuring the thickness of an electronic component by applying an electromagnetic wave to the electronic component and a transparent plate, a method for manufacturing a series of electronic components using the electronic component thickness measurement method, a series of electronic components manufactured by the manufacturing method, and an inspection apparatus for an electronic component. Regarding elements and steps similar to those of the first preferred embodiment, the description will not be repeated herein.

Second Preferred Embodiment

Figure 22:
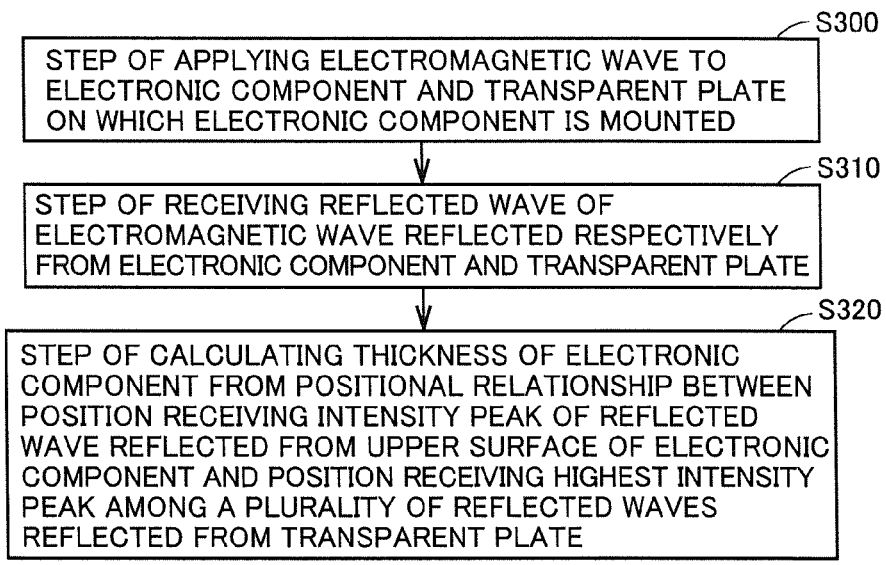
FIG. 22 is a flowchart showing an electronic component thickness measurement method according to a second preferred embodiment of the present invention.

FIG. 22 is a flowchart showing an electronic component thickness measurement method according to the second preferred embodiment of the present invention. As shown in FIG. 22, the electronic component thickness measurement method according to the second preferred embodiment of the present invention preferably includes the step of applying an electromagnetic wave to an electronic component and a transparent plate 110 on which the electronic component is mounted (S300); the step of receiving reflected waves of the electromagnetic wave reflected respectively from the electronic component and the transparent plate 110 (S310); and the step of calculating the thickness of the electronic component from a positional relationship between a position receiving an intensity peak of the reflected wave reflected from the upper surface of the electronic component and a position receiving a highest intensity peak among a plurality of reflected waves reflected from the transparent plate 110 (S320).

In the present preferred embodiment, irradiation unit 150a of thickness meter 150 applies, to an electronic component and transparent plate 110, p-polarized wave or s-polarized wave, for example, which is an electromagnetic wave. Moreover, thickness meter 150 calculates the thickness of the electronic component based on the positions where respective intensity peaks of reflected waves are received, without forming image data by reception unit 150b as in the first preferred embodiment.

Specifically, thickness meter 150 identifies, by a numerical value, the distance from a reference line to the position receiving an intensity peak of the reflected wave reflected from the upper surface of the electronic component, and identifies, by a numerical value, the distance from the reference line to the position receiving a highest intensity peak among a plurality of reflected waves reflected from transparent plate 110. The reference line is a virtual reference line and perpendicular or substantially perpendicular to a virtual straight line connecting, by a shortest distance, the position receiving the intensity peak of the reflected wave reflected from the upper surface of the electronic component and the position receiving the highest intensity peak among a plurality of reflected waves reflected from transparent plate 110.

As described above, the distribution of the electromagnetic wave amount of the reflected waves reflected from transparent plate 110 exhibits attenuation and decrease with increase of the number of multi-reflections. Therefore, the highest intensity peak among a plurality of reflected waves reflected from transparent plate 110 is the intensity peak of the reflected wave reflected from the upper surface of transparent plate 110. In the present preferred embodiment, the boundaries between the intensity peaks are definite and therefore the heights of the intensity peaks can easily be compared with each other.

Thickness meter 150 calculates a difference between the distance from the reference line to the position receiving the intensity peak of the reflected wave reflected from the upper surface of the electronic component and the distance from the reference line to the position receiving the intensity peak of the reference wave reflected from the upper surface of transparent plate 110, and corrects the result of this calculation in accordance with angle of incidence $\theta_1$ of the incident wave. Accordingly, the thickness of the electronic component mounted on transparent plate 110 is accurately measured via the light section method.

It should be noted that the electromagnetic waves may be applied to one electronic component multiple times. Specifically, each of the step of applying an electromagnetic wave (S300), the step of receiving reflected waves (S310), and the step of calculating the thickness of the electronic component may be performed for positions on one electronic component that are different from each other.

Respective measurements of the thickness can thus be taken at different portions of an electronic component to select the maximum measurement of the thickness from the taken measurements. Accordingly, the measurement is close to the maximum thickness of the electronic component.

In the present preferred embodiment, the step of applying an electromagnetic wave (S300) applies an electromagnetic wave to at least any one of a plurality of external electrodes 2. In the step of applying an electromagnetic wave (S300), the electromagnetic wave may be applied so that each of a plurality of external electrodes 2 is irradiated with the electromagnetic wave.

Figure 23:
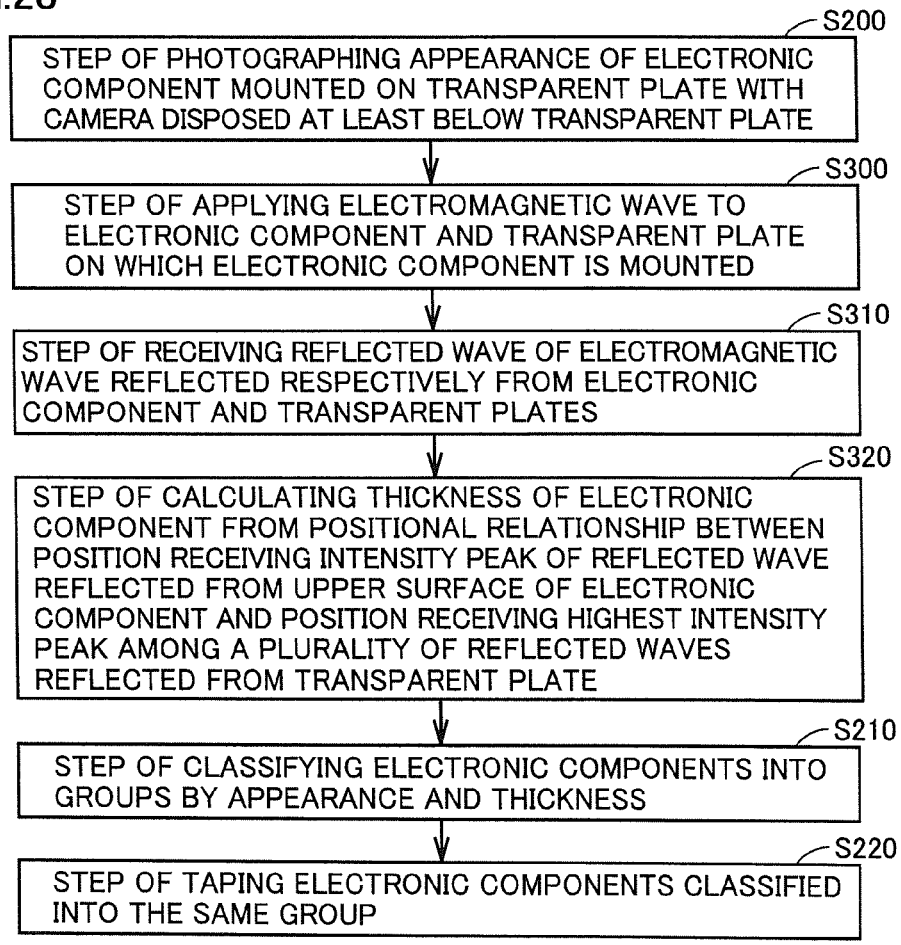
FIG. 23 is a flowchart showing a method for manufacturing a series of electronic components according to the second preferred embodiment of the present invention.

In the following, a description will be made, with reference to drawings, of a method for manufacturing a series of electronic components via the above-described electronic component thickness measurement method. FIG. 23 is a flowchart showing the method for manufacturing a series of electronic components according to the present preferred embodiment.

As shown in FIG. 23, the method for manufacturing a series of electronic components in the present preferred embodiment includes the step of photographing an appearance of an electronic component mounted on a transparent plate 110 via a photography device disposed at least below the transparent plate 110 (S200); the step of applying an electromagnetic wave to the electronic component and the transparent plate 110 on which the electronic component is mounted (S300); the step of receiving reflected waves of the electromagnetic wave reflected respectively from the electronic component and the transparent plate 110 (S310); the step of calculating the thickness of the electronic component from a positional relationship between a position receiving an intensity peak of the reflected wave reflected from the upper surface of the electronic component and a position receiving a highest intensity peak among a plurality of reflected waves reflected from the transparent plate 110 (S320); the step of classifying a plurality of electronic components into a plurality of groups, according to the appearance of each electronic component photographed in the step of photographing and the thickness of each electronic component calculated in the step of calculating the thickness of the electronic component (S210); and the step of taping a plurality of electronic components classified into any one group of the plurality of groups (S220).

Regarding the method for manufacturing a series of electronic components according to the present preferred embodiment, the series of electronic components 20 can be made up of only the electronic components having been identified as non-defective in both the appearance inspection and the thickness inspection. Accordingly, the series of electronic components 20 made up of only the multiplayer ceramic capacitors 3 having no chips and no cracks and having a variation in thickness of within about 10 μm, for example, can be manufactured.

Although various preferred embodiments of the present invention have been described and illustrated in detail, it is clearly understood that the same is by way of illustration and example only and is not to be taken by way of limitation, the scope of the present invention being interpreted by the terms of the appended claims.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An electronic component thickness measurement method comprising the steps of:
    applying a first electromagnetic wave from obliquely above to an electronic component and a transparent plate on which the electronic component is mounted;
    receiving reflected waves of the first electromagnetic wave and forming first image data including a first reference line representing an intensity peak of a reflected wave reflected from an upper surface of the electronic component and a plurality of second reference lines representing respective intensity peaks of a plurality of reflected waves reflected from the transparent plate;
    applying a second electromagnetic wave, which is different from the first electromagnetic wave in a direction of polarization, from obliquely above and at a same angle as the first electromagnetic wave, to a position on the electronic component and the transparent plate identical or substantially identical to a position to which the first electromagnetic wave is applied;

receiving reflected waves of the second electromagnetic wave and forming second image data including a first reference line representing an intensity peak of a reflected wave reflected from the upper surface of the electronic component and a plurality of second reference lines representing respective intensity peaks of a plurality of reflected waves reflected from the transparent plate;

extracting, from a plurality of the second reference lines in the first image data and a plurality of the second reference lines in the second image data, only a second reference line at which a difference in intensity peak between respective second reference lines at a same position in the first image data and the second image data is smallest, and forming third image data including the first reference line and the extracted second reference line; and calculating a thickness of the electronic component from a distance between the first reference line and the second reference line in the third image data.

2. The electronic component thickness measurement method according to claim 1, wherein the first electromagnetic wave and the second electromagnetic wave each have a wavelength of about 400 nm or more and about 500 nm or less.

3. The electronic component thickness measurement method according to claim 1, wherein
the electronic component includes a plurality of external electrodes on a surface of the electronic component; and
in the step of applying a first electromagnetic wave, the first electromagnetic wave is applied to at least any one of the plurality of the external electrodes.

4. The electronic component thickness measurement method according to claim 3, wherein in the step of applying a first electromagnetic wave, the first electromagnetic wave is applied so that a plurality of the external electrodes are each irradiated with the first electromagnetic wave.

5. The electronic component thickness measurement method according to claim 1, wherein each of the step of applying a first electromagnetic wave, the step of forming first image data, the step of applying a second electromagnetic wave, the step of forming second image data, the step of forming third image data, and the step of calculating the thickness of the electronic component is performed at positions on the electronic component that are different from each other.

6. The electronic component thickness measurement method according to claim 1, wherein the transparent plate has a thickness of about 1.2 mm or more and about 5.0 mm or less.

7. The electronic component thickness measurement method according to claim 1, wherein
the transparent plate is made of glass;
the first electromagnetic wave and the second electromagnetic wave differ from each other in direction of polarization by 90° or about 90°; and
an angle of incidence of the first electromagnetic wave with respect to the upper surface of the electronic component is about 10° or more and about 43.5° or less.

8. A method for manufacturing a series of electronic components including a plurality of electronic components packaged into a single unit, the method comprising the steps of:

photographing an appearance of each of the plurality of electronic components mounted on a transparent plate via a photography device disposed at least below the transparent plate;

applying a first electromagnetic wave from obliquely above to the electronic components and the transparent plate;

receiving reflected waves of the first electromagnetic wave and forming first image data including a first reference line representing an intensity peak of a reflected wave reflected from upper surfaces of the electronic components and a plurality of second reference lines representing respective intensity peaks of a plurality of reflected waves reflected from the transparent plate;

applying a second electromagnetic wave, which is different from the first electromagnetic wave in a direction of polarization, from obliquely above and at a same angle as the first electromagnetic wave, to a position on the electronic components and the transparent plate identical or substantially identical to a position to which the first electromagnetic wave is applied;

receiving reflected waves of the second electromagnetic wave and forming second image data including a first reference line representing an intensity peak of a reflected wave reflected from the upper surfaces of the electronic components and a plurality of second reference lines representing respective intensity peaks of a plurality of reflected waves reflected from the transparent plate;

extracting, from a plurality of the second reference lines in the first image data and a plurality of the second reference lines in the second image data, only a second reference line at which a difference in intensity peak between respective second reference lines at a same position in the first image data and the second image data is smallest, and forming third image data including the first reference line and the extracted second reference line;

calculating thicknesses of the electronic components from a distance between the first reference line and the second reference line in the third image data;

classifying a plurality of the electronic components into a plurality of groups, according to the appearance of each of the plurality of electronic components photographed in the step of photographing and the thickness of each of the plurality of electronic components calculated in the step of calculating the thickness of the electronic component; and taping ones of the plurality of the electronic components classified into any one group of the plurality of groups.

9. The method for manufacturing a series of electronic components according to claim 8, wherein the first electromagnetic wave and the second electromagnetic wave each have a wavelength of about 400 nm or more and about 500 nm or less.

10. The method for manufacturing a series of electronic components according to claim 8, wherein
each of the electronic components include a plurality of external electrodes on a surface of the respective electronic component; and
in the step of applying a first electromagnetic wave, the first electromagnetic wave is applied to at least any one of the plurality of the external electrodes.

11. The method for manufacturing a series of electronic components according to claim 10, wherein in the step of applying a first electromagnetic wave, the first electromagnetic wave is applied so that the plurality of the external electrodes are each irradiated with the first electromagnetic wave.

12. The method for manufacturing a series of electronic components according to claim 8, wherein each of the step of applying a first electromagnetic wave, the step of forming first image data, the step of applying a second electromagnetic wave, the step of forming second image data, the step of forming third image data, and the step of calculating the thickness of the electronic component is performed for positions on the electronic components that are different from each other.

13. The method for manufacturing a series of electronic components according to claim 8, wherein the transparent plate has a thickness of about 1.2 mm or more and about 5.0 mm or less.

14. The method for manufacturing a series of electronic components according to claim 8, wherein
the transparent plate is made of glass;
the first electromagnetic wave and the second electromagnetic wave differ from each other in a direction of polarization by 90° or about 90°; and
an angle of incidence of the first electromagnetic wave with respect to the upper surfaces of the electronic components is about 10° or more and about 43.5° or less.

15. A method for manufacturing a series of electronic components including a plurality of electronic components packaged into a single unit, the method comprising the steps of:
photographing an appearance of each of the electronic components mounted on a transparent plate via a photography device disposed at least below the transparent plate;
applying an electromagnetic wave to the electronic components and the transparent plate;
receiving reflected waves of the electromagnetic wave reflected respectively from the electronic components and the transparent plate;
calculating thicknesses of the electronic components from a positional relationship between a position receiving an intensity peak of the reflected wave reflected from upper surfaces of the electronic components and a position receiving a highest intensity peak among a plurality of reflected waves reflected from the transparent plate;
classifying a plurality of the electronic components into a plurality of groups, according to the appearance of each the electronic component photographed in the step of photographing and the thickness of each the electronic component calculated in the step of calculating the thickness of the electronic component; and
taping a plurality of the electronic components classified into any one group of the plurality of groups.

16. The method for manufacturing a series of electronic components according to claim 15, wherein
each of the electronic components include a plurality of external electrodes on a surface of the respective electronic component; and
in the step of applying an electromagnetic wave, the electromagnetic wave is applied to at least any one of the plurality of the external electrodes.

17. The method for manufacturing a series of electronic components according to claim 16, wherein in the step of applying an electromagnetic wave, the electromagnetic wave is applied so that the plurality of the external electrodes are each irradiated with the electromagnetic wave.

18. The method for manufacturing a series of electronic components according to claim 15, wherein each of the step of applying an electromagnetic wave, the step of receiving reflected waves, and the step of calculating the thickness of the electronic component is performed for positions on each of the electronic components that are different from each other.

19. A series of electronic components manufactured via the method for manufacturing a series of electronic components recited in claim 8, a difference in thickness between a thickest electronic component and a thinnest electronic component among a plurality of the electronic components classified into the one group is about 10 µm or less.

20. The series of electronic components according to claim 19, wherein
each of the electronic components includes a body and external electrodes;
the body includes a pair of main surfaces located opposite to each other, a pair of end surfaces connecting the pair of main surfaces to each other and located opposite to each other, and a pair of side surfaces connecting the pair of main surfaces to each other and also connecting the pair of end surfaces to each other;
the external electrodes are provided on each of the pair of main surfaces; and
the thickness of the electronic component is a distance, along a direction connecting the pair of main surfaces, between outer surfaces of the external electrodes provided on each of the pair of main surfaces.

21. The series of electronic components according to claim 19, wherein the thickness of a thickest electronic component among a plurality of the electronic components classified into the one group is about 0.25 mm or less.

22. An inspection apparatus for an electronic component for conducting an appearance inspection and taking a thickness measurement, the apparatus comprising:
a transparent plate on which the electronic component is mounted;
a photography device configured to photograph an appearance of the electronic component at least from below the transparent plate; and
a thickness meter measuring the thickness of the electronic component, the thickness meter including an irradiation unit and a reception unit; wherein
the irradiation unit is configured to apply an electromagnetic wave to the electronic component and the transparent plate;
the reception unit is configured to receive reflected waves of the electromagnetic wave reflected respectively from the electronic component and the transparent plate;
the thickness meter is configured to calculate the thickness of the electronic component from a positional relationship between a position receiving an intensity peak of the reflected wave reflected from an upper surface of the electronic component and a position receiving a highest intensity peak among a plurality of reflected waves reflected from the transparent plate;
the irradiation unit is configured to apply a first electromagnetic wave from obliquely above to the electronic component and the transparent plate, and apply a second electromagnetic wave, which is different from the first electromagnetic wave in direction of polarization, from obliquely above and at a same angle as the first electromagnetic wave, to a position on the electronic component and the transparent plate identical or substantially identical to a position to which the first electromagnetic wave is applied;
the reception unit is configured to receive reflected waves of the first electromagnetic wave and form first image data including a first reference line representing an intensity peak of a reflected wave reflected from the upper surface of the electronic component and a plurality of second reference lines representing respective intensity peaks of a plurality of reflected waves reflected from the transparent plate, and the reception unit is configured to receive reflected waves of the second electromagnetic wave and form second image data including a first reference line representing an intensity peak of a reflected wave reflected from the upper surface of the electronic component and a plurality of second reference lines representing respective intensity peaks of a plurality of reflected waves reflected from the transparent plate; and the thickness meter is configured to extract, from a plurality of the second reference lines in the first image data and a plurality of the second reference lines in the second image data, only a second reference line at which a difference in intensity peak between respective second reference lines at a same position in the first image data and the second image data is smallest, form third image data including the first reference line and the extracted second reference line, and calculate the thickness of the electronic component from a distance between the first reference line and the second reference line in the third image data.

23. The inspection apparatus for an electronic component according to claim 22, wherein the first electromagnetic wave and the second electromagnetic wave each have a wavelength of about 400 nm or more and about 500 nm or less.

24. The inspection apparatus for an electronic component according to claim 22, wherein the electronic component includes a plurality of external electrodes on a surface of the electronic component; and the irradiation unit is configured to apply the first electromagnetic wave to at least any one of a plurality of the external electrodes.

25. The inspection apparatus for an electronic component according to claim 24, wherein the irradiation unit is configured to apply the first electromagnetic wave so that the plurality of the external electrodes are each irradiated with the first electromagnetic wave.

26. The inspection apparatus for an electronic component according to claim 22, wherein the transparent plate is made of glass;

the first electromagnetic wave and the second electromagnetic wave differ from each other in a direction of polarization by 90° or about 90°; and an angle of incidence of the first electromagnetic wave with respect to the upper surface of the electronic component is about 10° or more and about 43.5° or less.

27. The inspection apparatus for an electronic component according to claim 22, wherein the thickness meter is configured to measure respective thicknesses at positions different from each other on the electronic component.

28. The inspection apparatus for an electronic component according to claim 22, wherein the transparent plate has a thickness of about 1.2 mm or more and about 5.0 mm or less.

29. The inspection apparatus for an electronic component according to claim 22, further comprising a classification mechanism configured to classify a plurality of electronic components into a plurality of groups; wherein the classification mechanism includes a plurality of containers configured to receive the electronic components and a plurality of discharge mechanisms configured to move the electronic components on the transparent plate into the container.

* * * * *